(12) United States Patent
Braunisch et al.

(10) Patent No.: US 10,763,216 B2
(45) Date of Patent: Sep. 1, 2020

(54) MULTI-CHIP PACKAGE AND METHOD OF PROVIDING DIE-TO-DIE INTERCONNECTS IN SAME

(71) Applicant: Intel Corporation, Santa Clara, CA (US)

(72) Inventors: Henning Braunisch, Chandler, AZ (US); Chia-Pin Chiu, Tempe, AZ (US); Aleksandar Aleksov, Chandler, AZ (US); Hinmeng Au, Phoenix, AZ (US); Stefanie M. Lotz, Phoenix, AZ (US); Johanna M. Swan, Scottsdale, AZ (US); Sujit Sharan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/677,533

(22) Filed: Nov. 7, 2019

(65) Prior Publication Data

US 2020/0075493 A1 Mar. 5, 2020

Related U.S. Application Data

(62) Division of application No. 15/876,080, filed on Jan. 19, 2018, now Pat. No. 10,510,669, which is a (Continued)

(51) Int. Cl.
*H01L 23/538* (2006.01)
*H01L 23/13* (2006.01)
(Continued)

(52) U.S. Cl.
CPC ......... *H01L 23/5385* (2013.01); *H01L 23/13* (2013.01); *H01L 23/5381* (2013.01);
(Continued)

(58) Field of Classification Search
CPC ............................ H01L 23/5385; H01L 23/13
(Continued)

(56) References Cited

U.S. PATENT DOCUMENTS 5,198,963 A * 3/1993 Gupta ................ G01R 31/2863
257/737
5,352,632 A 10/1994 Sawaya et al.
(Continued)

FOREIGN PATENT DOCUMENTS

CN 1835229 A 9/2006
EP 1841063 10/2007
(Continued)

OTHER PUBLICATIONS

Office Action for Chinese Patent Application No. 20180028083.5, dated Oct. 28, 2013, 25 pages (Including English Language Translation).
(Continued)

*Primary Examiner* — Jami Valentine Miller
(74) *Attorney, Agent, or Firm* — Schwabe, Williamson & Wyatt, P.C.

(57) ABSTRACT

A multi-chip package includes a substrate (110) having a first side (111), an opposing second side (112), and a third side (213) that extends from the first side to the second side, a first die (120) attached to the first side of the substrate and a second die (130) attached to the first side of the substrate, and a bridge (140) adjacent to the third side of the substrate and attached to the first die and to the second die. No portion of the substrate is underneath the bridge. The bridge creates a connection between the first die and the second die. Alternatively, the bridge may be disposed in a cavity (615, 915) in the substrate or between the substrate and a die layer
(Continued)

(750). The bridge may constitute an active die and may be attached to the substrate using wirebonds (241, 841, 1141, 1541).

19 Claims, 12 Drawing Sheets

Related U.S. Application Data division of application No. 13/531,827, filed on Jun. 25, 2012, now Pat. No. 9,875,969, which is a division of application No. 12/459,007, filed on Jun. 24, 2009, now Pat. No. 8,227,904.

(51) Int. Cl.
  *H01L 23/00* (2006.01)
  *H01L 25/065* (2006.01)
  *H01L 21/683* (2006.01)

(52) U.S. Cl.
  CPC .............. *H01L 24/14* (2013.01); *H01L 24/73* (2013.01); *H01L 25/0652* (2013.01); *H01L 25/0655* (2013.01); *H01L 25/0657* (2013.01); *H01L 21/6835* (2013.01); *H01L 24/17* (2013.01); *H01L 24/45* (2013.01); *H01L 24/48* (2013.01); *H01L 24/49* (2013.01); *H01L 24/81* (2013.01); *H01L 2224/0401* (2013.01); *H01L 2224/13099* (2013.01); *H01L 2224/141* (2013.01); *H01L 2224/1403* (2013.01); *H01L 2224/16145* (2013.01); *H01L 2224/16225* (2013.01); *H01L 2224/17181* (2013.01); *H01L 2224/32245* (2013.01); *H01L 2224/45099* (2013.01); *H01L 2224/45147* (2013.01); *H01L 2224/48091* (2013.01); *H01L 2224/48227* (2013.01); *H01L 2224/49175* (2013.01); *H01L 2224/73207* (2013.01); *H01L 2224/73253* (2013.01); *H01L 2224/81001* (2013.01); *H01L 2224/81005* (2013.01); *H01L 2224/81801* (2013.01); *H01L 2225/0651* (2013.01); *H01L 2225/06513* (2013.01); *H01L 2225/06517* (2013.01); *H01L 2225/06562* (2013.01); *H01L 2924/00011* (2013.01); *H01L 2924/00014* (2013.01); *H01L 2924/014* (2013.01); *H01L 2924/01005* (2013.01); *H01L 2924/01006* (2013.01); *H01L 2924/01015* (2013.01); *H01L 2924/01029* (2013.01); *H01L 2924/01032* (2013.01); *H01L 2924/01033* (2013.01); *H01L 2924/01076* (2013.01); *H01L 2924/01079* (2013.01); *H01L 2924/10253* (2013.01); *H01L 2924/10271* (2013.01); *H01L 2924/10329* (2013.01); *H01L 2924/12042* (2013.01); *H01L 2924/1461* (2013.01); *H01L 2924/15153* (2013.01); *H01L 2924/19107* (2013.01); *H01L 2924/351* (2013.01)

(58) Field of Classification Search
  USPC .......................................... 257/723; 438/128
  See application file for complete search history.

(56) References Cited

U.S. PATENT DOCUMENTS

| | | | |
|---|---|---|---|
| 5,608,262 | A | 3/1997 | Degani et al. |
| 5,760,478 | A | 6/1998 | Bozso |
| 6,294,406 | B1 | 9/2001 | Berin et al. |
| 6,659,512 | B1 | 12/2003 | Harper et al. |
| 6,731,009 | B1 | 4/2004 | Jones et al. |
| 7,098,542 | B1 | 8/2006 | Hoang et al. |
| 7,198,980 | B2 | 4/2007 | Jiang et al. |
| 7,208,826 | B2 | 4/2007 | Sakamoto et al. |
| 7,402,901 | B2 | 7/2008 | Hatano et al. |
| 7,525,199 | B1 | 4/2009 | Lauterbach et al. |
| 7,554,203 | B2 | 6/2009 | Zhou |
| 8,064,224 | B2 | 11/2011 | Mahajan et al. |
| 8,227,904 | B2 | 7/2012 | Braunisch et al. |
| 8,399,776 | B2 | 3/2013 | Appelt et al. |
| 2002/0005576 | A1* | 1/2002 | Sakamoto ........... H01L 21/4828 257/687 |
| 2003/0127749 | A1 | 7/2003 | Lin et al. |
| 2004/0036152 | A1 | 2/2004 | Harper et al. |
| 2005/0046040 | A1 | 3/2005 | Wang et al. |
| 2005/0116358 | A1 | 6/2005 | Haba et al. |
| 2005/0127492 | A1 | 6/2005 | Howard |
| 2005/0230842 | A1 | 10/2005 | Swanson et al. |
| 2006/0226527 | A1* | 10/2006 | Hatano ............... H01L 23/5389 257/686 |
| 2006/0249828 | A1 | 11/2006 | Hong |
| 2007/0080442 | A1 | 4/2007 | Meyer Berg et al. |
| 2008/0088030 | A1 | 4/2008 | Eldridge et al. |
| 2008/0111222 | A1 | 5/2008 | Sheridan et al. |
| 2008/0150157 | A1 | 6/2008 | Nishimura et al. |
| 2008/0179735 | A1 | 7/2008 | Urakawa et al. |
| 2008/0217767 | A1 | 9/2008 | Tago |

FOREIGN PATENT DOCUMENTS

| | | |
|---|---|---|
| JP | 01-282892 | 11/1989 |
| JP | 03-64060 | 3/1991 |
| JP | 07-302859 | 11/1995 |
| JP | 10-303363 | 11/1998 |
| JP | H11-289047 | 10/1999 |
| JP | 11-345932 | 12/1999 |
| JP | 2000-100851 | 4/2000 |
| JP | 2001-176928 | 6/2001 |
| JP | 2001-358247 | 12/2001 |
| JP | 2002-359345 | 12/2002 |
| JP | 2003-124431 | 4/2003 |
| JP | 2009-324183 | 11/2003 |
| JP | 2004-111415 | 4/2004 |
| JP | 2004-320012 | 11/2004 |
| JP | 2005-109416 | 4/2005 |
| JP | 2006-19433 | 1/2006 |
| JP | 2006-066898 | 3/2006 |
| JP | 2006-261311 | 9/2006 |
| JP | 2007-260866 | 10/2007 |
| JP | 2007-267113 | 10/2007 |
| JP | 2008-004714 | 1/2008 |
| JP | 2008-187050 | 8/2008 |
| JP | 2011-044654 | 3/2011 |
| KR | 10-1997-0013137 | 3/1997 |
| SU | 1691912 | 11/1991 |
| TW | 200636972 | 10/2006 |
| WO | WO 2005/093834 | 2/2008 |
| WO | WO 2010/151350 | 12/2010 |

OTHER PUBLICATIONS

Office Action for Chinese Patent Application No. 20180028083.5, dated Jun. 27, 2014, 17 pages (Including English Language Translation).

Office Action for Chinese Patent Application No. 20180028083.5, dated Dec. 11, 2014, 18 pages (Including English Language Translation).

Notice of Allowance for Chinese Patent Application No. 20180028083.5, dated Jun. 17, 2015, 18 pages (Including English Language Translation).

Office Action for German Patent Application No. 112010002705.6, dated May 26, 2014, 10 pages.

Office Action for German Patent Application No. 112010002705.6, dated Feb. 3, 2017, 16 pages (including English Language translation).

Office Action for Great Britain Patent Application No. 1119496.6, dated May 23, 2013, 3 pages.

(56) References Cited

OTHER PUBLICATIONS

Office Action for Great Britain Patent Application No. 1119496.6, dated Oct. 29, 2013, 3 pages.
Grant for Great Britain Patent Application No. 1119496.6, dated May 14, 2014, 2 pages.
Office Action for Great Britain Patent Application No. 1317126.9, dated Oct. 23, 2013, 3 pages.
Grant for Great Britain Patent Application No. 1317126.9, dated Jun. 25, 2014, 4 pages.
Office Action for Great Britain Patent Application No. 1403118.1, dated Mar. 4, 2014, 4 pages.
Office Action for Great Britain Patent Application No. 1403118.1, dated Apr. 15, 2014, 2 pages.
Grant for Great Britain Patent Application No. 1403118.1, dated Aug. 27, 2014, 2 pages.
Office Action for Great Britain Patent Application No. 1403119.9, dated Mar. 4, 2014, 4 pages.
Grant for Great Britain Patent Application No. 1403119.9, dated Jun. 25, 2014, 4 pages.
Office Action for Great Britain Patent Application No. 1403120.7, dated Mar. 18, 2014, 4 pages.
Grant for Great Britain Patent Application No. 1403120.7, dated Jul. 2, 2014, 4 pages.
Office Action for Japanese Patent Application No. 2012-514953, dated Apr. 23, 2013 4 pages (Including English Language Summary).
Office Action for Japanese Patent Application No. 2012-514953, dated Nov. 29, 2013 4 pages (Including English Language Summary).
Notice of Allowance for Japanese Patent Application No. 2012-514953, dated Mar. 28, 2014, 2 pages.
Office Action for Japanese Patent Application No. 2014-097127, dated Jul. 2, 2015 3 pages (Including English Language Summary).
Office Action for Japanese Patent Application No. 2014-097127, dated Dec. 24, 2015 3 pages (Including English Language Summary).
Notice of Allowance for Japanese Patent Application No. 2014-097127, dated Apr. 14, 2016, 3 pages.
Office Action for Japanese Patent Application No. 2016-120986, dated May 24, 2017, 5 pages (Including English Language Translation).
Office Action for Japanese Patent Application No. 2016-120986, dated Dec. 11, 2017, 5 pages (Including English Language Translation).
Notice of Allowance for Japanese Patent Application No. 2016-120986, dated Mar. 30, 2018, 1 pages.
Office Action for Korean Patent Application No. 10-2011-7031155, dated May 8, 2013, 8 pages.
International Search Report and Written Opinion for PCT/US2010/027035, dated Aug. 31, 2010, 9 pages.
International Preliminary Report on Patentability for PCT/US2010/027035, dated Jan. 12, 2012, 8 pages.
Notice of Allowance for Russian Patent Application No. 2011153254, dated Apr. 1, 2013, 12 pages.
Office Action for Taiwan Patent Application No. 099109406, dated Dec. 20, 2013, 37 pages.
Notice of Allowance for Taiwan Patent Application No. 099109406, dated Jun. 25, 2014, 2 pages.
Drost, Robert J., et al., "Proximity Communication", Sun Microsystems, Inc., IEEE 2003, Custom Integrated Circuits Conference, pp. 469-472.
Drost, Robert, et al., "Electronic Alignment for Proximity Communication", Sun Microsystems, ISSCC 2004/Session 7/ [81 TD: Scalling Trends/7.7, IEEE International Solid-State Circuits Conference, Feb. 2004, 10 pgs.
Shubin, Ivan, et al., "Optical Proximity Communication", Sun Microsystems Microelectronics Physical Science Center, Optoelectronic Integrated Circuits XI, Proc. of SPIE vol. 7219, 8 pgs.
Kumagai, Kouichi, et al., "A Silicon Interposer BGA Package with Cu-Filled TSV and Multi-Layer Cu-Plating Interconnect", System Fabrication Technologies, Inc., IEEE 2008 Components and Technology Conference, pp. 571-576.
Sunohara, Masahiro, et al., "Silicon Interposer with TSVs (Through Silicon Vias) and Fine Multilayer Wiring", Shinko Electric Industries Co., Ltd., IEEE 2008 Electronic Components and Technology Conference, pp. 847-852.
Drost, Robert J., et al, "Proximity Communication", IEEE Journal of Solid-State Circuits, vol. 39, No. 9, Sep. 2004,pp. 1529-1535.
Zheng, Xuezhe, et al., "Optical Transceiver Chips Based on Co-Integration of Capacitively Coupled Proximity Interconnects and VCSDELs", IEEE Photonics Technology Letters, vol. 19, No. 7, Apr. 1, 2007, pp. 453-455.
Bernstien, Gary H., et al., "Quilt Packaging: High-Density, High-Speed, Interchip Communications", IEEE Transactions on Advanced Packaging, vol. 30, No. 4, Nov. 2007, pp. 731-740.
Bernstien, Gary H., et al., "Quilt Packaging: A New Paradigm for Interchip Communication", Department of Electrical Engineering, IEEE 2005 Electronics Packaging Technology Conference, 6 pgs.
Sze, T., et al., "Proximity Communication Flip-Chip Package with Micron Chip-to-chip Alignment Tolerances", Sun Microsystems, Qualcomm CDMA Technologies, IEEE 2009 Electronic Components and Technology Conference, pp. 966-971.
Morozova, N.D., et al., "Controlled Solder Self-alignment Sequence for an Optoelectronic Module without Mechanical Stops", IEEE 1997 Electronic Components and Technology Conference, pp. 1188-1193.
Zheng, Xuezhe, et al., "BGA Package Integration of Electrical, Optical, and Capacitive Interconnects", Sun Microsystems, 2009 IEEE Electronic Components and Technology Conference, pp. 191-195.
Office Action for Indian Patent Application No. 9172/DELNP/2011, dated Mar. 5, 2018, 6 pages.
Office Action for Japanese Patent Application No. 2018-087607, dated Dec. 18, 2019, 6 pgs.
Office Action for Great Britain Patent Application No. 1403120.7, dated Mar. 18, 2014, 5 pgs.
Office Action from U.S. Appl. No. 13/531,827, dated Feb. 1, 2013, 11 pgs.
Office Action from U.S. Appl. No. 13/531,827, dated Jul. 25, 2013, 8 pgs.
Office Action from U.S. Appl. No. 13/531,827, dated Nov. 14, 2013, 7 pgs.
Office Action from U.S. Appl. No. 13/531,827, dated Jun. 23, 2014, 7 pgs.
Office Action from U.S. Appl. No. 13/531,827, dated Oct. 27, 2014, 20 pgs.
Office Action from U.S. Appl. No. 13/531,827, dated Mar. 5, 2015, 15 pgs.
Office Action from U.S. Appl. No. 13/531,827, dated Jul. 10, 2015, 12 pgs.
Office Action from U.S. Appl. No. 13/531,827, dated Dec. 30, 2015, 11 pgs.
Office Action from U.S. Appl. No. 13/531,827, dated Jun. 3, 2016, 12 pgs.
Office Action from U.S. Appl. No. 13/531,827, dated Sep. 20, 2016, 15 pgs.
Office Action from U.S. Appl. No. 13/531,827, dated Feb. 28, 2017, 18 pgs.
Notice of Allowance from U.S. Appl. No. No. 13/531,827, dated Sep. 15, 2017, 7 pgs.
Office Action from U.S. Appl. No. 12/459,007, dated Jun. 2, 2011, 19 pgs.
Office Action from U.S. Appl. No. 12/459,007, dated Nov. 3, 2011, 10 pgs.
Notice of Allowance from U.S. Appl. No. 12/459,007, dated Mar. 23, 2012, 7 pgs.
Office Action from Japanese Patent Application No. 2018-087607, dated May 21, 2019, 17 pages.

(56) References Cited

OTHER PUBLICATIONS

Notice of Allowance from Japanese Patent Application No. 2018-087607, dated Sep. 24, 2019, 4 pgs.

\* cited by examiner

MULTI-CHIP PACKAGE AND METHOD OF PROVIDING DIE-TO-DIE INTERCONNECTS IN SAME

CLAIM OF PRIORITY

This application is a divisional of U.S. patent application Ser. No. 15/876,080, filed Jan. 19, 2018, which is a divisional of U.S. patent application Ser. No. 13/531,827 filed Jun. 25, 2012, now U.S. Pat. No. 9,875,969 issued Jan. 23, 2018, which is a divisional of U.S. patent application Ser. No. 12/459,007, filed on Jun. 24, 2009, now U.S. Pat. No. 8,227,904 issued Jul. 24, 2012, the entire contents of which are hereby incorporated by reference herein.

FIELD OF THE INVENTION

The disclosed embodiments of the invention relate generally to multi-chip packages, and relate more particularly to interconnect structures in such packages.

BACKGROUND OF THE INVENTION

A continuing focus of the microelectronics industry is the enablement of computer chips (also referred to as dies) having greater density, higher performance, and lower cost. As part of this effort, microelectronic packages containing multiple dies have been developed. Such multi-chip packages (MCPs) offer the potential for increased architectural flexibility at reduced cost but to do so must provide appropriate die-to-die interconnect densities in a way that is cost-effective. The interconnect density is an important consideration because an insufficient number of die connections would limit the bandwidth capability for the affected die interface, and thus logic-logic and/or logic-memory communications would suffer.

BRIEF DESCRIPTION OF THE DRAWINGS

The disclosed embodiments will be better understood from a reading of the following detailed description, taken in conjunction with the accompanying figures in the drawings in which.

Figure 1A:
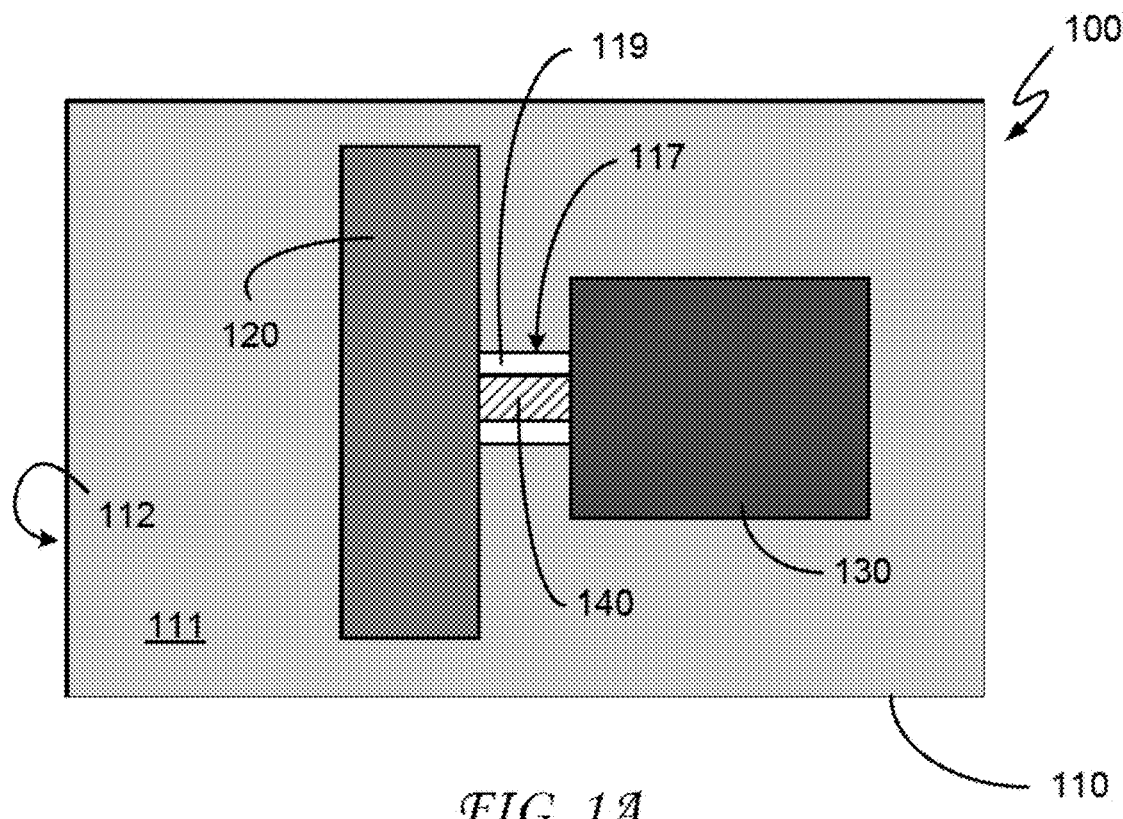
FIGS. 1A, 1B, and 1C are plan views of a multi-chip package according to various embodiments of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a multi-chip package comprises a substrate having a first side, an opposing second side, and a third side that extends from the first side to the second side, a first die attached to the first side of the substrate and a second die also attached to the first side of the substrate, and a bridge adjacent to the third side of the substrate and attached to the first die and to the second die. No portion of the substrate is underneath the bridge. The bridge creates a connection between the first die and the second die. Alternatively, the bridge may be disposed in a cavity in the substrate or between the substrate and a die layer. The bridge may constitute an active die and may be attached to the substrate using wirebonds.

Shrinking die sizes coupled with increasing die performance requirements dictate that the density of the corresponding die-to-die interconnects must be increased. As may be expected, several manufacturing issues must be addressed in order to accomplish this goal. One such issue is the difficulty inherent in fabricating interconnects within an organic substrate material. In order to overcome this problem, a silicon interposer sandwiched between the dies and the package substrate has been proposed. The use of a standard copper damascene process allows fabrication of lines and spaces of submicron dimensions. However, the large silicon interposer area and need for through-silicon vias (TSVs) make this approach an expensive one, thus negating the perceived MCP-derived cost benefits.

Embodiments of the invention enable density scaling of interconnect structures that represents an accelerated improvement over existing technology generations by making use of silicon bridges (or bridges made of other materials) that are embedded in or attached to the package substrate. These bridges need to support only the dense die-to-die interconnect from die edge to die edge and can consequently be much smaller than a silicon interposer. The silicon bridge concept also eliminates the need for TSV technology. In addition to greatly increased communication bandwidth due to high density interconnect structures, embodiments of the invention may also enable improved assembly processes due (at least in part) to the maturity of silicon process technology.

Certain embodiments of the invention may enable the fabrication of MCPs having unprecedented die-to-die interconnect densities that would in turn enable MCP-type cost savings, modularity, and architectural flexibility. Examples of such potential benefits include improved reticle and wafer utilization by die aspect ratio optimization, the ability to combine within a single package dies using different optimized silicon (or other) processes or dies incorporating differing or incompatible design methodologies, the potential to assemble non-rectangular or large "super-dies," the ability to combine dies or die stacks with differing heights, and others.

Embodiments of the invention also enable the precise alignment of bridges, including silicon bridges, to a package substrate. Such alignment may be important in the creation of an overall well-defined bump field for subsequent die attach, especially in view of the high interconnect densities targeted on the silicon bridges. Furthermore, an on-die type density may allow reuse of existing circuit designs with minimal modification, and many available pins at the die-package interface may enable simple protocols and good input/output (I/O) power efficiency.

Some embodiments of the invention make use of a hybrid flip-chip/wirebond assembled active "satellite" die (or dies) where the die is flip-chip connected to at least one processing unit die and is also connected by wirebond directly to the package substrate. The processing unit die is assembled to the package substrate using flip-chip interconnects. The flip-chip interconnects between the satellite die and the processing unit die enable high-density, high-speed communication between the satellite die and the processing unit die and also (where multiple processing unit dies are involved) allow the satellite die to play the role of a high-speed silicon bridge enabling high-speed, high-density connectivity between two or more processing unit dies in addition to providing the active functionality of the satellite die to one or more of the processing unit dies. The wirebond connections to the satellite die allow for power delivery to that die and further allow additional I/O or control signal connectivity apart from that provided by the flip chip connections to the processing unit die(s). As with the embodiments described above, TSVs are avoided altogether.

Figure 1B:
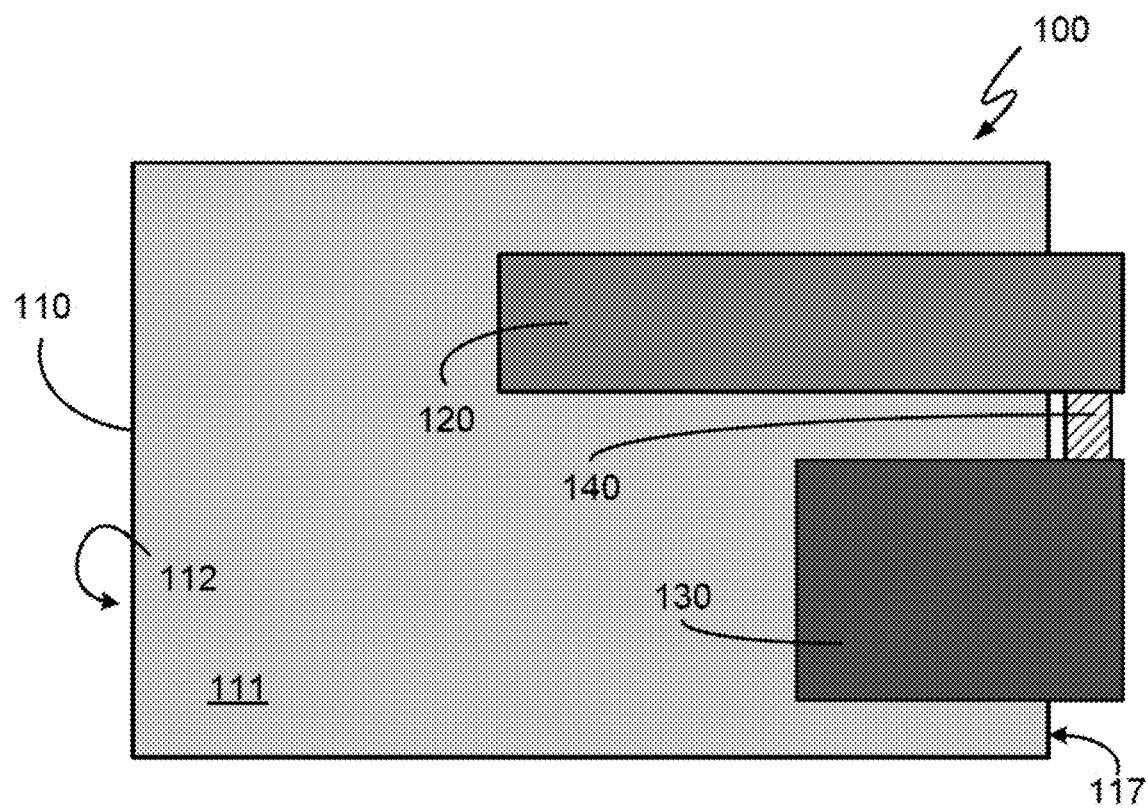
Figure 1C:
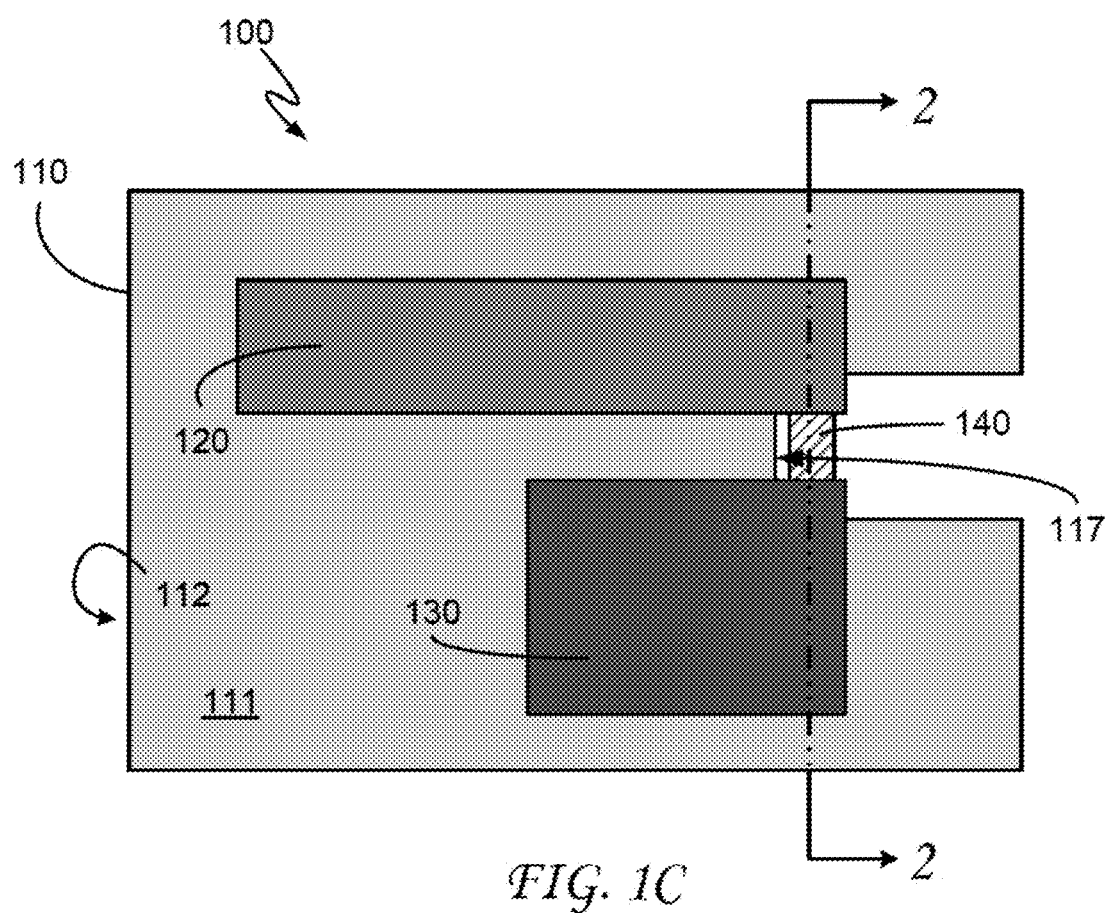
Figure 2:
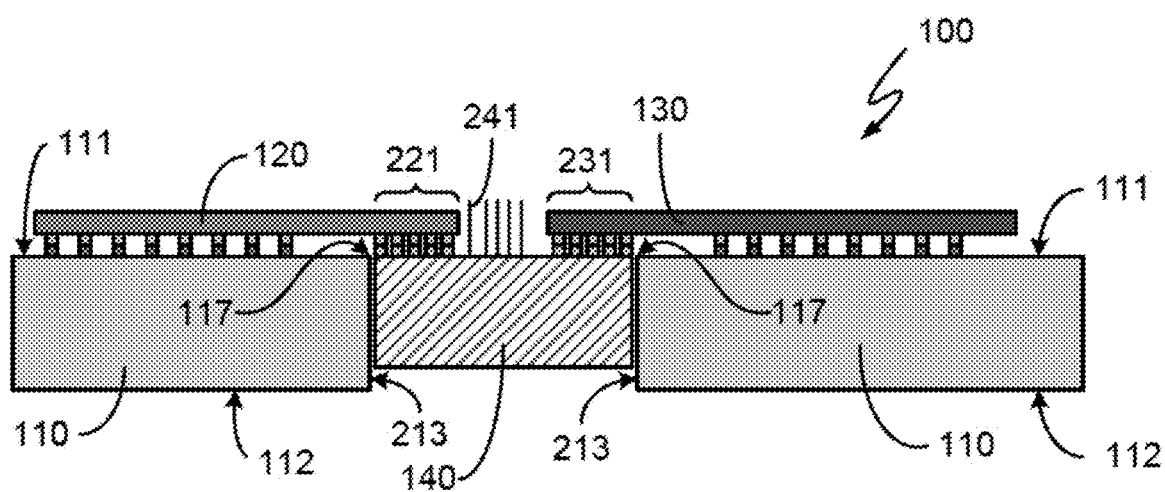
FIG. 2 is a cross-sectional view of the multi-chip package of FIG. 1C according to an embodiment of the invention.

Referring now to the drawings, FIGS. 1A, 1B, and 1C are plan views of a multi-chip package 100 according to various embodiments of the invention and FIG. 2 is a cross-sectional view, taken at a line 2-2 in FIG. 1C, of multi-chip package 100 according to an embodiment of the invention. (Views of corresponding cross sections of FIGS. 1A and 1B would be very similar or identical to the cross section depicted in FIG. 2.) As illustrated in FIGS. 1A-1C and FIG. 2, multi-chip package 100 comprises a substrate 110 having a side 111, an opposing side 112, and a side 213 that extends from side 111 to side 112. Multi-chip package 100 further comprises a die 120 and a die 130, both of which are attached to side 111 of substrate 110, and a bridge 140 adjacent to side 213 of substrate 110 and attached to die 120 and to die 130. As illustrated, and as further discussed below, no portion of substrate 110 is underneath bridge 140 such that there is an unobstructed path to dies 120 and 130 through or along substrate 110 for bridge 140. Bridge 140 creates a connection (e.g., an electrical or optical connection or the like) between die 120 and die 130 by matching electrically and/or optically conductive traces running through the bridge with pads or other interconnect structures on the dies.

In certain embodiments, as mentioned above, bridge 140 comprises silicon. Silicon bridges are used because silicon process technology is relatively advanced, and interconnect pitches and line widths that are achievable using existing silicon process technology are significantly smaller than what is possible using, for example, currently available technology for copper lines in polymer layers. Thus die-to-die interconnects may be constructed with much greater density when silicon bridges are used than when such interconnects are fabricated within typical organic substrate materials. Speaking generally, embodiments of the invention employ silicon bridges with high density solder bumps and fine lines, with the latter being made using traditional silicon processes.

In some embodiments, bridge 140 can be a passive component, in that it has no functionality other than to provide a high-speed, high-density signaling pathway between dies 120 and 130. In other embodiments, bridge 140 comprises an active die, having its own functionality apart from a bridging function, that constitutes a third die (die 120 and die 130 being the first two) of multi-chip package 100. In such embodiments, bridge 140 could have a design enabled for hybrid assembly, such as having both bumps for flip-chip interconnects and pads for wirebond connections prepared on the same side (surface) of the active die. Furthermore, such embodiments could reduce manufacturing expenses. For example, a processing unit die requiring on-package external memory in addition to connectivity with another processing unit die could be served by a single bridge die having fast local memory functionality, thus eliminating the need for any additional components, as such a bridge would provide both functions.

As an example, the active die can be an active silicon die, or the active die can comprise other semiconducting materials such as gallium arsenide (GaAs), silicon germanium (SiGe), or any other suitable semiconducting material or combination of semiconducting materials. Although this description will from time to time make reference to an "active silicon die," it should be understood that active dies of any suitable semiconducting material or combination of materials are also contemplated. It should also be understood that what are referred to herein as active dies, no matter what material or materials they are made of, have their own functionality apart from their ability to act as a bridge and provide connections between other dies.

In the illustrated embodiments, the intersection of side 111 and side 213 creates an edge 117. In FIG. 1A, edge 117 is an internal substrate edge because it lies along an inside perimeter of substrate 110. In contrast, edge 117 in FIGS. 1B and 1C is an external substrate edge because it lies along an outside perimeter of substrate 110. In the latter embodiment (FIGS. 1B and 1C), side 213 constitutes a portion of an outside perimeter of substrate 110, i.e., a perimeter that circumscribes all of substrate 110, while in the former embodiment (FIG. 1A) side 213 constitutes a portion of an inside perimeter of substrate 110, i.e., a perimeter that circumscribes an internal feature of substrate 110, such as an aperture 119, but does not circumscribe all of substrate 110.

As illustrated, dies 120 and 130 are arranged such that they overhang an internal or an external edge of substrate 110: a portion 221 of die 120 overhangs edge 117 and, similarly, a portion 231 of die 130 overhangs edge 117. As suggested above, die overhang at an internal substrate edge implies substrate 110 has an aperture, such as aperture 119. In at least some embodiments this aperture is slightly larger than bridge 140. In cases where multiple bridges are desired multiple apertures may be provided, or smaller apertures can be combined into a larger aperture accommodating multiple bridges, depending on design requirements. Overhang at an external substrate edge implies that dies 120 and 130 are mounted near the package substrate periphery, as discussed above and as illustrated in FIG. 1B. In certain cases, however, the overhang amount may be greater than desired, which can negatively impact I/O routing, power delivery, thermal management, and the like. These issues may possibly be overcome by using a slotted package substrate such as that shown in FIG. 1C.

It may be seen in FIG. 2 that the portions of dies 120 and 130 that overhang edge 117 (and that are connected to bridge 140), i.e., portions 221 and 231, respectively, contain interconnect structures having a much smaller pitch than do the interconnect structures at the non-overhanging portions of dies 120 and 130. This is consistent with what has been said above regarding the pitches that are achievable both within and outside of bridge 140. In one embodiment, the fine-pitch interfaces (i.e., those contained in portions 221 and 231) are formed separately from the coarse-pitch interfaces at the non-overhanging portions of dies 120 and 130. Regarding these interconnect structures, it should be mentioned that those described herein as having a "fine pitch" do not necessarily all have the same pitch as each of the other "fine pitch" interconnect structures, nor do all of the "coarse pitch" interconnect structures necessarily have the same (coarser) pitch as each of the other "coarse pitch" interconnect structures. Rather, each of the "fine pitch" interconnect structures have, in general, a pitch that is finer than any of the "coarse pitch" interconnect structures, but individual pitch variations may exist from one interconnect structure to another. Electrical signaling analysis for dense die-to-die interconnects for silicon bridges has shown that signaling without repeaters is possible at relevant densities and over lengths required (e.g., up to two millimeters). Additionally, in at least one embodiment, some or all of these interconnect structures may comprise flip-chip or controlled collapse chip connect (C4) connections. (The "flip-chip" and "C4" labels are used interchangeably herein.) Because such connections are well known in the art the details of their structure and manufacture will not be discussed herein except to say that the manufacture is transparent to the particular technology used (whether reflow, thermocompression bonding, or some other process).

For reasons discussed below, in some embodiments (such as, for example, where bridge 140 is an active silicon die), bridge 140 is attached to substrate 110 using wirebonds 241. (These wirebonds have been omitted from FIGS. 1A-1C in order to increase the clarity of those figures.) Only a portion of wirebonds 241 are shown in FIG. 2 because the perspective of that figure makes it difficult to depict the full extent of the wirebonds. It should be understood, however, that wirebonds 241 continue in an unbroken path from bridge 140 to substrate 110 in order to create an electrical connection between bridge 140 and substrate 110.

As mentioned above, no TSVs are needed in bridge 140 or for the other bridges/satellite dies described herein. The satellite dies are connected to the processing unit dies using flip-chip (face-to-face) connections in order to allow for interfacing the processing unit and satellite die I/O and for providing an interface (where desired) for die-to-die bridge functionality. All or some of the other (slower) I/Os of the satellite die and its power and ground connects are, in certain embodiments, supplied by wirebonds. This represents a possible cost savings. An advantage of using wirebonding to supply the I/O and power and ground connections, rather than supplying such connections through a connected processing unit die, is that the processing unit dies would not then need the infrastructure required to provide power and additional I/Os that are not needed for the processing unit die itself, which additional infrastructure and associated overhead would likely increase the processing unit die area and significantly increase the processing unit cost. Also, if used without a satellite die this additional infrastructure in the processing unit would be wasted.

Figure 3:
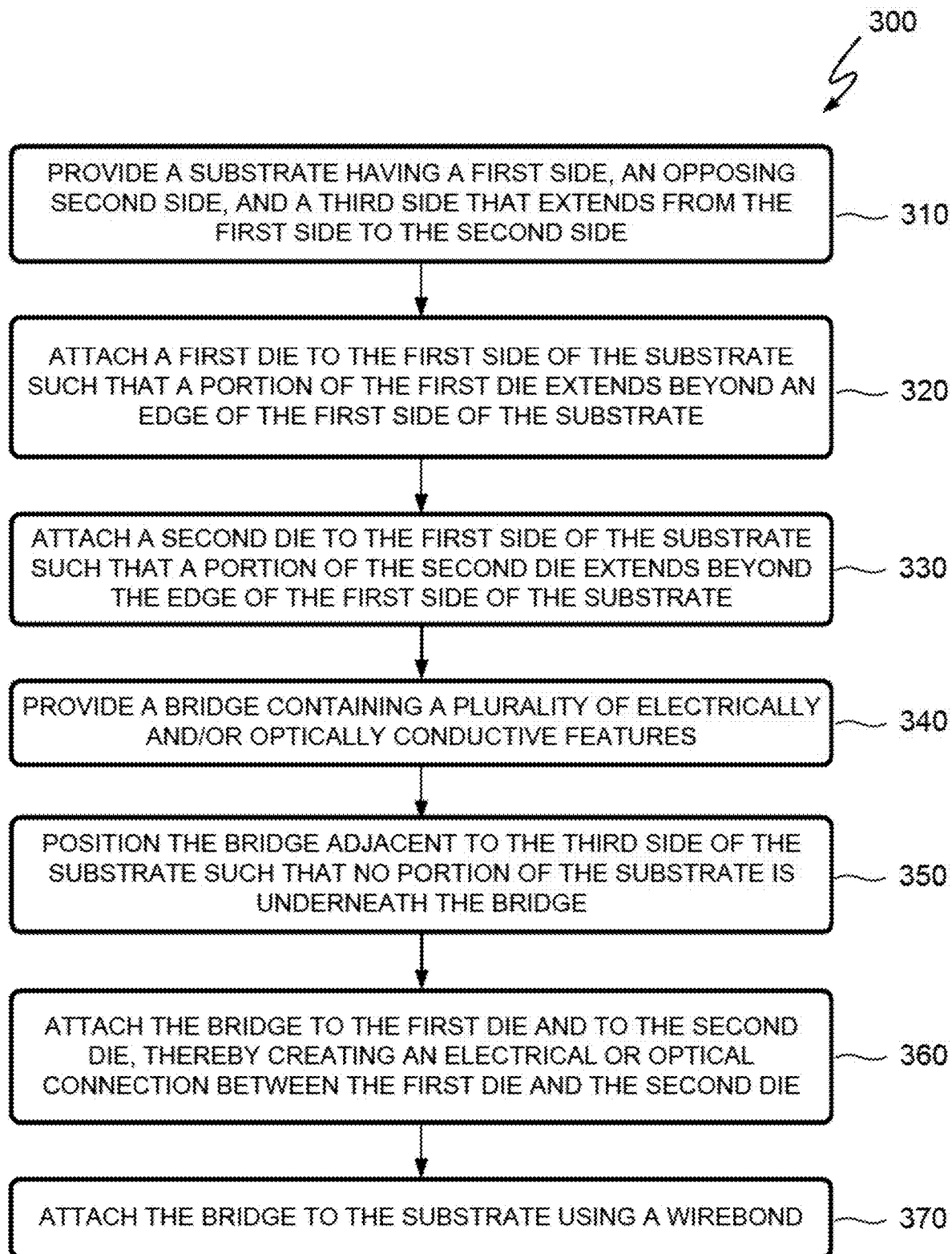
FIGS. 3 and 4 are flowcharts illustrating methods of providing die-to-die interconnects in a multi-chip package according to embodiments of the invention.

FIG. 3 is a flowchart illustrating a method 300 of providing die-to-die interconnects in a multi-chip package according to an embodiment of the invention. As an example, method 300 may represent a portion of a manufacturing process that results in the formation of a multi-chip package that is similar to multi-chip package 100 as shown in FIGS. 1A, 1B, 1C, and 2. Although these figures depict a single bridge connecting two dies, other embodiments of the invention may involve more than two dies and/or more than a single bridge.

A step 310 of method 300 is to provide a substrate having a first side, an opposing second side, and a third side that extends from the first side to the second side. As an example, the substrate can be similar to substrate 110, and the first side, the second side, and the third side can be similar to, respectively, side 111, side 112, and side 213 of substrate 110. Sides 111 and 112 are first shown in FIG. 1A, and side 213 is shown in FIG. 2. In one embodiment, step 310 comprises forming an aperture through the substrate such that the third side constitutes a portion of an inside perimeter of the substrate. As an example, this embodiment may result in an MCP such as that shown in FIG. 1A. In another embodiment, step 310 comprises forming a slot in the substrate such that the third side constitutes a portion of an outside perimeter of the substrate. As an example, this embodiment may result in an MCP such as that shown in FIG. 1C. Either of these embodiments may be characterized by a lower cost than that likely required for a bridge embedded in a substrate cavity as described elsewhere herein. Indeed, in cases where coreless substrates or other thin substrates are to be used such embodiments may be the only viable option. As an example, apertures or slots such as those discussed above may be formed by mechanical or laser drilling, milling, routing, stamping, punching, etching, or the like.

A step 320 of method 300 is to attach a first die to the first side of the substrate such that a portion of the first die extends beyond an edge of the first side of the substrate. As an example, the first die can be similar to die 120 that is first shown in FIG. 1A. As another example, the edge of the first side of the substrate can be similar to edge 117, and the portion of the first die that extends beyond the edge can be similar to portion 221 of die 120, which portion is first shown in FIG. 2.

A step 330 of method 300 is to attach a second die to the first side of the substrate such that a portion of the second die extends beyond the edge of the first side of the substrate. As an example, the second die can be similar to die 130 that is first shown in FIG. 1A. As another example, the portion of the second die that extends beyond the edge can be similar to portion 231 of die 130, which portion is first shown in FIG. 2. In one embodiment, steps 320 and 330 may be combined into a single step. In the same or another embodiment the die attachment of steps 330 and 320 (or of the single step that combines the two) comprises an alignment function facilitated by solder self-alignment. Note that in an embodiment such solder self-alignment occurs during the coarse-pitch MCP die attach step or steps and the dies may be precisely positioned with respect to each other by virtue of a single lithographically defined solder mask pattern on the first side of the substrate.

A step 340 of method 300 is to provide a bridge containing a plurality of electrically and/or optically conductive features. As an example, the bridge can be similar to bridge 140 that is first shown in FIG. 1A. Accordingly, in some embodiments the bridge can be an active silicon die. As another example, the electrically conductive features can be metal traces or the like as known in the art that are suitable for conducting electricity between one region and another, or one component and another, of an MCP, while the optically conductive features can be, for example, optical waveguides such as silicon nitride waveguides, rib waveguides, and the like, or optical coupling elements such as gratings, micro-mirrors, and lenses.

A step 350 of method 300 is to position the bridge adjacent to the third side of the substrate such that no portion of the substrate is underneath the bridge. This arrangement allows for a mechanical decoupling of the bridge and the substrate—materials that have a large mismatch in coefficient of thermal expansion (CTE). Furthermore, an unconstrained bridge could offer package stress benefits because it could move without creating a bending load on the fine-pitch joints. Thus, method 300 may not require the use of an underfill or encapsulant to fill the space around the bride in the aperture or slot or the like. As an example, step 350 may be accomplished using a pick and place machine, as known in the art.

A step 360 of method 300 is to attach the bridge to the first die and to the second die, thereby creating an electrical or optical connection between the first die and the second die. Accordingly, step 360 may constitute an attachment from the backside of the package, i.e., method 300 may constitute a "bridge last" process flow. It should be noted that because no portion of the substrate is underneath the bridge, this "bridge last" process flow may allow the use of a full-thickness bridge (unless thermomechanical considerations indicate bridge thinning to be advantageous for fine-pitch interconnect reliability, or unless thinning is needed for form factor or mechanical clearance) where other process flows would require that a thinned bridge be used. Also, the "bridge last" process flow enables the building of MCPs with dies or die stacks of disparate heights without any modification to the outlined assembly flow while also providing a scaleable solution that enables affordable assembly of multiple bridges in a given MCP configuration.

In one embodiment, step 360 may be accomplished using a thermocompression bonding process. In another embodiment, step 360 comprises using a solder reflow process. As is known in the art, in thermocompression bonding temperature and pressure may be controlled; with a solder reflow process only the temperature may be controlled. As is also known, solder reflow is a high-throughput batch process. Thermocompression bonding is typically a sequential process; however, a "ganged" bonder can process several units at once. Thermocompression bonding may in certain embodiments be needed to achieve the fine-pitch interconnect because of its process flexibility and its better control of process parameters.

A step 370 of method 300 is to attach the bridge to the substrate using a wirebond. As an example, the wirebond can be similar to wirebonds 241 that are shown in FIG. 2. Step 370 may be performed, for example, in embodiments where the bridge is an active die. It should be understood, however, that step 370 is not necessarily performed in every embodiment of method 300.

Figure 4:
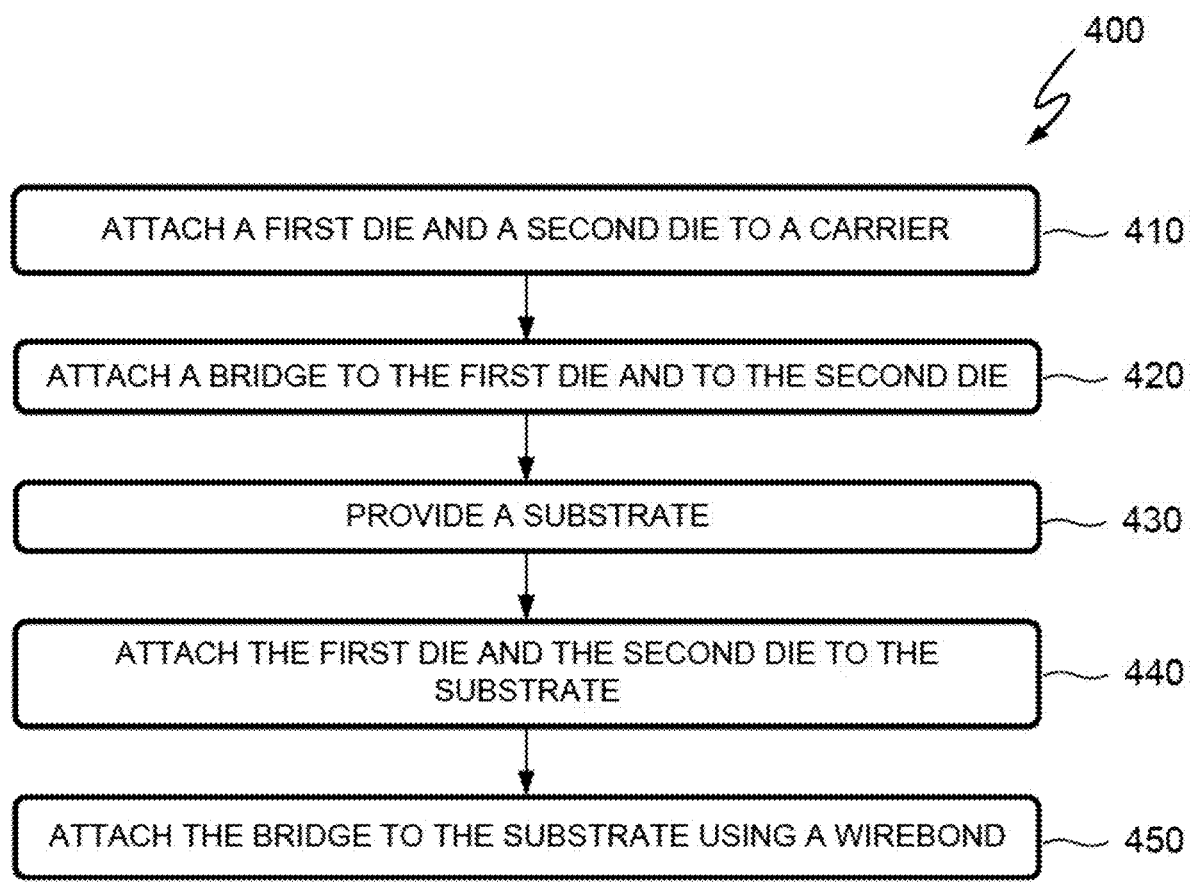

FIG. 4 is a flowchart illustrating a method 400 of providing die-to-die interconnects in a multi-chip package according to another embodiment of the invention. Method 400 is an assembly process enabling the precise alignment of bridges to MCP dies first, followed by the attachment of bridge and dies to a package substrate. This subsequent attachment of bridge and dies to the package substrate may be easier in the bridge-to-dies first process because it eliminates certain issues typically caused by mixed bump, fine pitches. Method 400 may also be employed, for example, when a substrate with a cutout cannot be provided and when an overhang over an external substrate edge is not an option due to design considerations. Method 400 and a multi-chip package 500 related thereto are further illustrated in FIGS. 5-8, which are cross-sectional views of multi-chip package 500 at various particular points in its manufacturing process according to embodiments of the invention.

As explained in further detail below, method 400 generally involves the attachment of dies to a carrier, fine pitch assembly of one or more bridges to the dies, coarse pitch assembly of the carrier, dies, and bridge(s) to a package substrate, and (optionally) de-bonding of the carrier. Potential advantages of this method over one or more of the other methods or embodiments described herein are that it eliminates the package substrate as a mechanical reference in the mixed-bump-pitch assembly flow, and that it forms the fine-pitch and coarser-pitch interconnects in separate steps. Furthermore, method 400 permits accurate bridge alignment in three dimensions. As stated above, accurate bridge alignment may be important in order to create an overall well-defined bump field for subsequent die attach. High interconnect densities accentuate this requirement.

Figure 5:
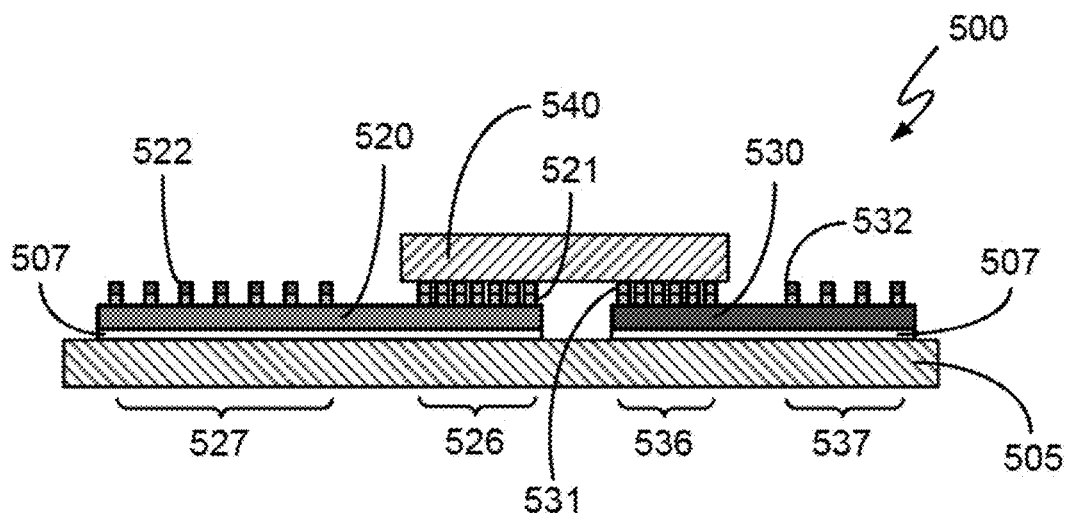
FIGS. 5-8 are cross-sectional views of multi-chip packages at various particular points in their manufacturing processes according to embodiments of the invention.

A step 410 of method 400 is to attach a first die and a second die to a carrier. When placing the dies, suitable fiducials on previously placed dies or on other components of the subassembly, such as the carrier, may be used as a reference. As an example, the first die and the second die can be similar to, respectively, die 120 and die 130 that are first shown in FIG. 1A. As another example, the first die and the second die can be similar to, respectively, a die 520 and a die 530 that are first shown in FIG. 5. Attached to die 520 are fine-pitch interconnect structures 521 and coarse-pitch interconnect structures 522. Attached to die 530 are fine-pitch interconnect structures 531 and coarse-pitch interconnect structures 532. More specifically, and as illustrated in FIG. 5 and subsequent figures, die 520 has a portion 526 containing interconnect structures 521 and a portion 527 containing interconnect structures 522. Similarly, die 530 has a portion 536 containing interconnect structures 531 and a portion 537 containing interconnect structures 532. As mentioned above, interconnect structures 521 and 531 have a first (fine) pitch and interconnect structures 522 and 532 have a second (coarse) pitch that is different from the first pitch. It may be seen that, as already mentioned elsewhere herein, portions 526 and 536 are attached to the bridge (by way of fine pitch interconnect structures 521 and 531). Note that interconnect structures 521 and 531 would typically be silicon to silicon structures rather than silicon to organic structures. As an example, this may help to forestall the problems that are typically associated with a mismatch in the CTE between the two materials.

The carrier can be similar to a carrier 505 that is first shown in FIG. 5. In one embodiment, the carrier comprises an integrated heat spreader (IHS). As an example, the heat spreader may be made of copper or the like. Due to the high thermal conductivity of the copper (or other) IHS, the package may be thermally enhanced. In the embodiment of FIG. 5, dies 520 and 530 are attached to carrier 505 using an adhesive material 507, which may comprise a thermal interface material (TIM) or the like.

A step 420 of method 400 is to attach a bridge to the first die and to the second die. Note that in this step only the fine pitch interconnect structures are attached. The small bump pitch may require highly accurate pick-and-place equipment. Again, on-die fiducials may be useful for achieving successful bonding. As an example, the bridge can be similar to bridge 140 that is first shown in FIG. 1A. As another example, the bridge can be similar to a bridge 540, first shown in FIG. 5, that, like bridge 140, may be made of silicon and may, further, be an active silicon die. In one embodiment, step 420 comprises using a thermocompression bonding process to bond the bridge and the dies to each other. In other embodiments, step 420 comprises using a solder reflow process or another attachment procedure as known in the art.

A step 430 of method 400 is to provide a substrate. As an example, the substrate can be similar to substrate 110 that is first shown in FIG. 1A. As another example, the substrate can be similar to a substrate 610 that is first shown in FIG. 6. Substrate 610 contains a cavity 615 that, in the illustrated embodiment, contains bridge 540 surrounded by a protective material 612 such as an encapsulant, an underfill material, an epoxy, or the like. Material 612 may be compliant or flexible in order to mechanically decouple bridge 540 and substrate 610, and its presence may enable undisturbed underfilling of dies 520 and 530.

Figure 7:
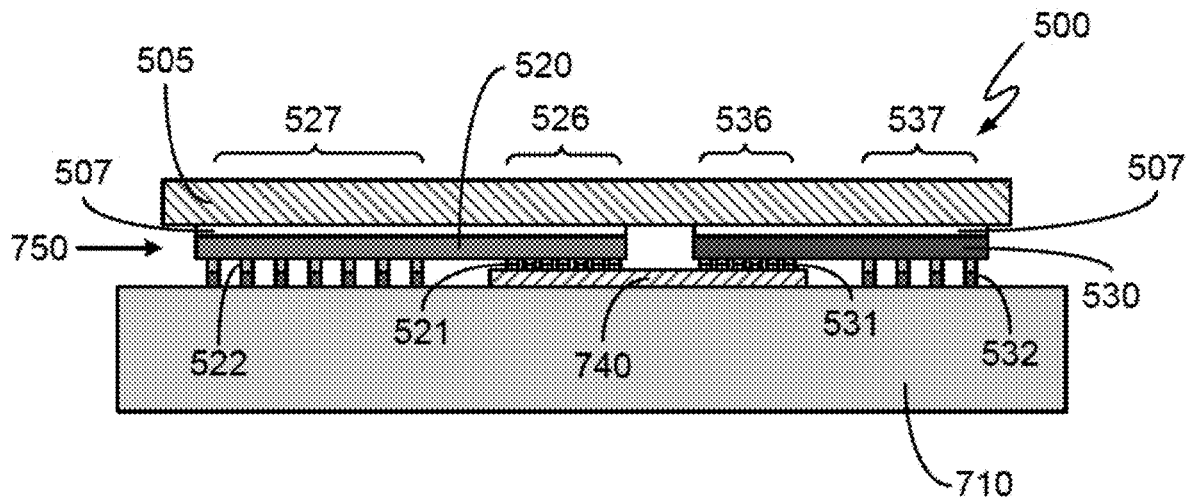

As still another example, the substrate can be similar to a substrate 710 that is first shown in FIG. 7. In the FIG. 7 embodiment, dies 520 and 530 form, or are located in, a die layer 750 of multi-chip package 500. Substrate 710 has no cavity; a bridge 740, which is significantly thinner than bridge 540, sits on a surface of substrate 710 or is otherwise located between substrate 710 and dies 520 and 530—in other words, bridge 740 is located between die layer 750 and the surface of the substrate. (In other respects bridge 740 can be similar to bridges 540 and 140 and can therefore, in certain embodiments, be an active die.) Also in the FIG. 7 embodiment, one or more of interconnect structures 521, 522, 531, and 532 may need to be modified in order to accommodate the reduced thickness of bridge 740. For example, interconnect structures 521 and 531 may need to be shortened while interconnect structures 522 and 532 may need to be lengthened in order to accommodate the different package geometry. As with other embodiments described herein, one or more of interconnect structures 521, 522, 531, and 532 may comprise flip-chip connections. It should be noted that bridge 740 may be thin enough that it requires its own carrier in order to facilitate handling, e.g. before and during step 420 of method 400.

Figure 6:
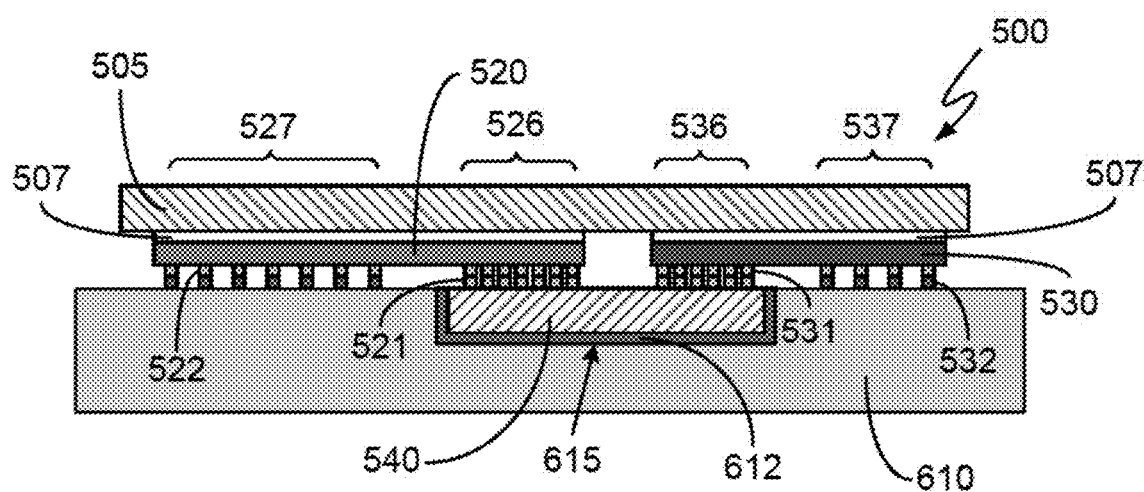

A step 440 of method 400 is to attach the first die and the second die to the substrate. In this step only the die bumps with a large pitch (outside the bridge area) are attached. Since the bump pitch is large, less expensive pick-and-place equipment can typically be used. The appearance of multi-chip package 500 following the performance of step 440 is illustrated in FIG. 6 for an embodiment using substrate 610 and in FIG. 7 for an embodiment using substrate 710.

Figure 8:
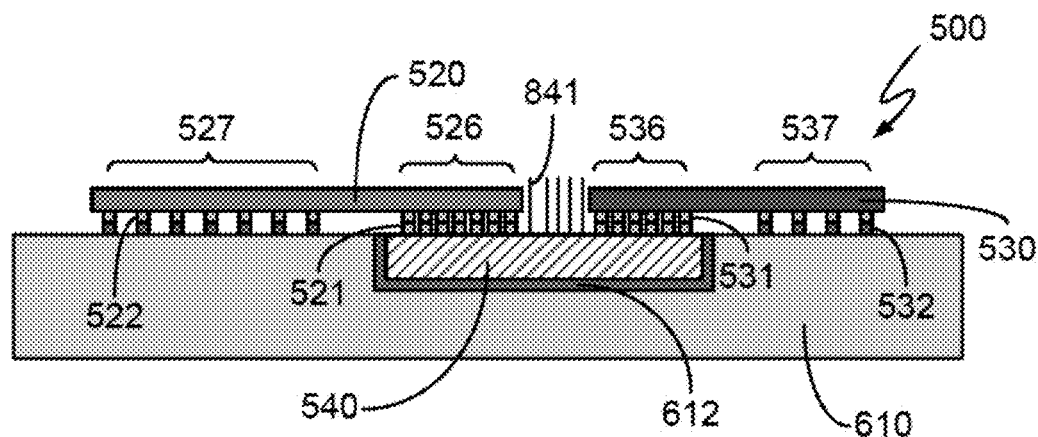

In some embodiments, step 440 is followed by the removal of the carrier. As an example, this may be accomplished by peeling, cutting, etching away, or melting the adhesive material, or otherwise de-bonding the carrier from the dies. FIG. 8 shows multi-chip package 500 following the removal of carrier 505. Carrier 505 in FIG. 7 may also be removed (not illustrated). In other embodiments, such as when the carrier is a heat spreader, step 440 is not performed and the carrier is permanently left in place.

In yet another embodiment (not illustrated), in order to accommodate dies of different thicknesses, a mix of single dies and die stacks, or die stacks of different heights, the carrier or IHS may be stepped such that before bridge-to-die attach the bumps to be interconnected by an individual bridge are coplanar. Suitable steps or cavities can be created by machining the carrier or IHS.

A step 450 of method 400 is to attach the bridge to the substrate using a wirebond. As an example, the wirebond can be similar to wirebonds 241 that are shown in FIG. 2 or to wirebonds 841 that are shown in FIG. 8. (The embodiment of FIG. 7 may also include wirebonds, or in other words bridge 740 may also, in certain embodiments, be connected to substrate 710 using wirebonds. Such wirebonds are not depicted in FIG. 7, however, because the presence in that figure of carrier 505 combined with the figure's cross-sectional nature make it difficult to illustrate the wirebonds clearly, or because the wirebonds are added after the removal of carrier 505.) Only a portion of wirebonds 841 are shown in FIG. 8 because the perspective of that figure makes it difficult to depict the full extent of the wirebonds. It should be understood, however, that wirebonds 841 continue in an unbroken path from bridge 540 to substrate 610 in order to create an electrical connection between bridge 540 and substrate 610. Step 450 may be performed, for example, in embodiments where the bridge is an active die. It should be understood, however, that step 450 is not necessarily performed in every embodiment of method 400.

Figure 9:
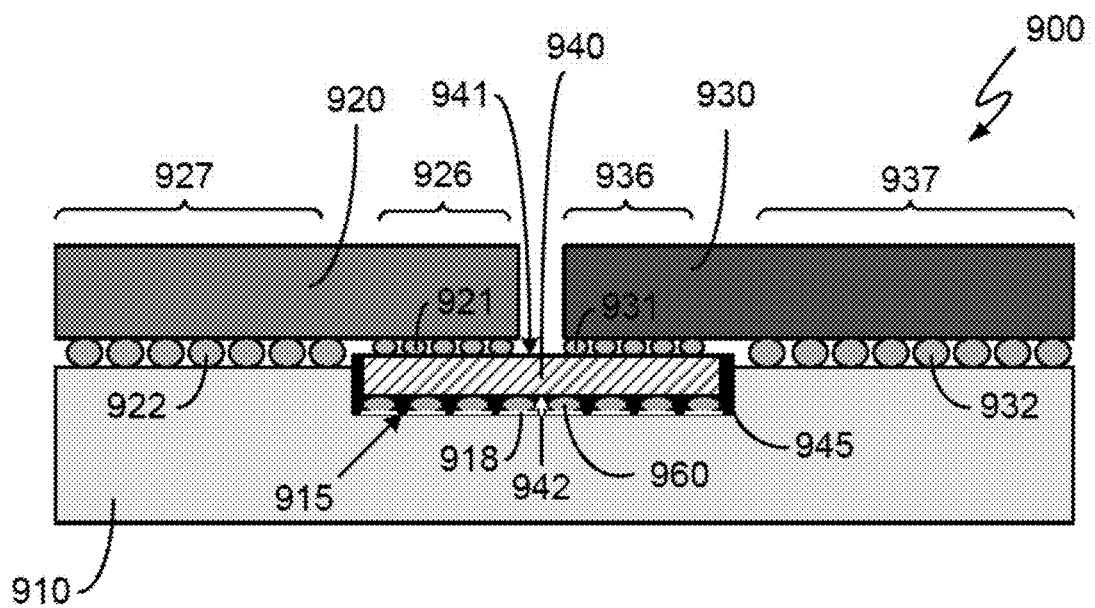
FIG. 9 is a cross-sectional view of a multi-chip package according to another embodiment of the invention.

FIG. 9 is a cross-sectional view of a multi-chip package 900 according to an embodiment of the invention. As illustrated in FIG. 9, multi-chip package 900 comprises a substrate 910 containing a cavity 915 having a plurality of pads 918 therein, a die 920 and a die 930 attached to substrate 910, a bridge 940 having a side 941 and an opposing side 942, and a plurality of joints 960 at side 942 of bridge 940. As an example, pads 918 and joints 960 can be electrically non-functional. Pads 918 may be prefabricated during conventional build-up processes and then exposed during cavity formation, for example by laser milling or the like.

An encapsulation material 945 at least partially surrounds bridge 940 in cavity 915 in the illustrated embodiment. As an example, substrate 910, die 920, die 930, and bridge 940 can be similar to, respectively, substrate 110, die 120, die 130, and bridge 140, all of which are first shown in FIG. 1A. Accordingly, in certain embodiments bridge 940 can be an active die. As may be seen in the figure, die 920 and die 930 are attached to side 941 of bridge 940, at least a portion of bridge 940 is located within cavity 915 such that the plurality of joints 960 are aligned with pads 918, and bridge 940 creates an electrical or optical connection between die 920 and die 930.

Die 920 has a portion 926 containing a plurality of interconnect structures 921 and a portion 927 containing a plurality of interconnect structures 922. Similarly, die 930 has a portion 936 containing a plurality of interconnect structures 931 and a portion 937 containing a plurality of interconnect structures 932. Interconnect structures 921 and 931 have a first (fine) pitch and interconnect structures 922 and 932 have a second (coarse) pitch that is different from the first pitch. Portions 926 and 936 are attached to the bridge (by way of fine pitch interconnect structures 921 and 931).

As has been discussed elsewhere herein, in some embodiments, such as, for example, where bridge 940 is an active die, bridge 940 is attached to substrate 910 using wirebonds. These wirebonds have not been depicted in FIG. 9 because the nature of that figure makes such depiction difficult. It should be understood, however, that, in a manner similar to what is shown in other figures described herein, the wirebonds continue in an unbroken path from bridge 940 to substrate 910 in order to create an electrical connection between bridge 940 and substrate 910.

Figure 10:
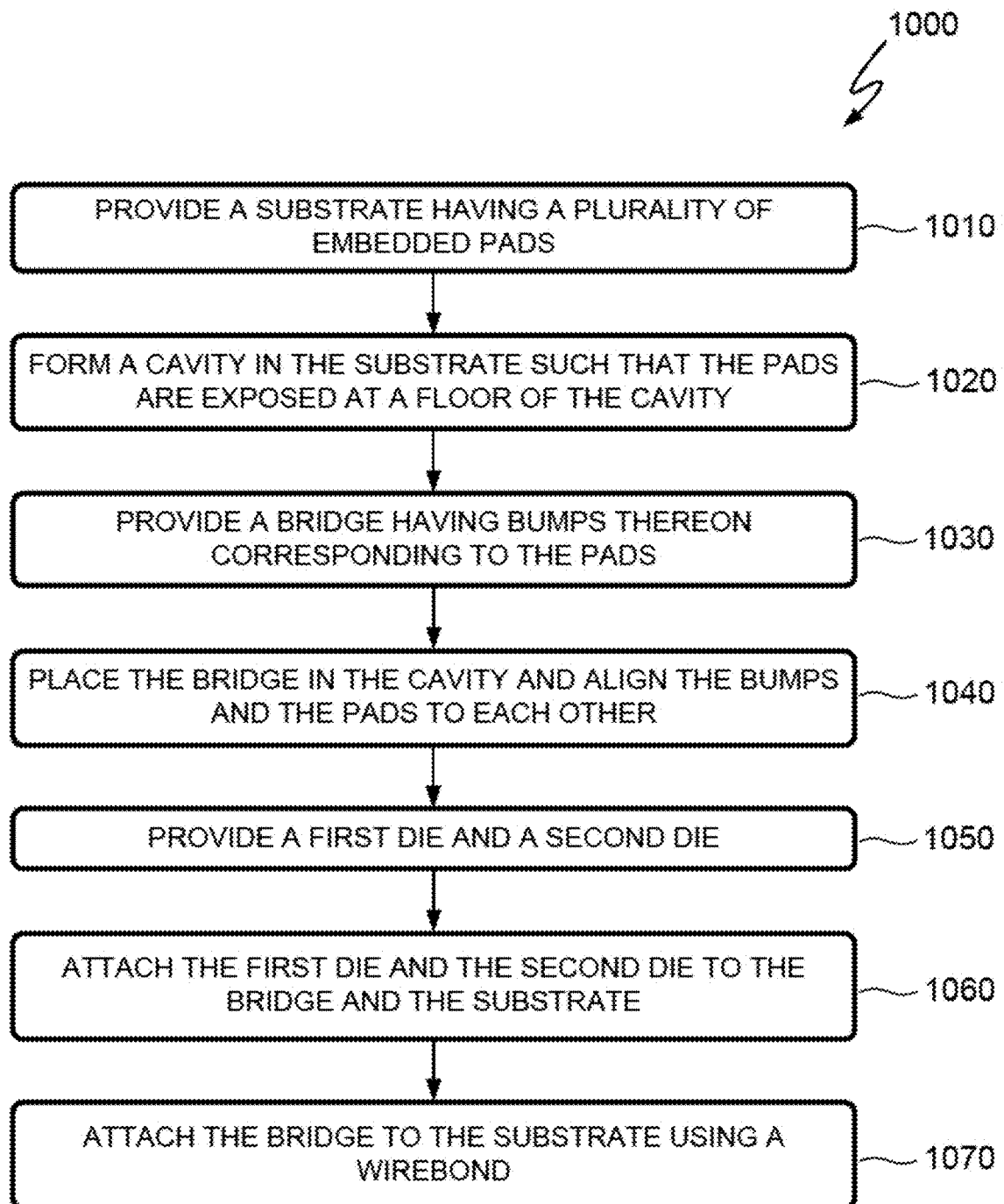
FIG. 10 is a flowchart illustrating a method of providing die-to-die interconnects in a multi-chip package according to another embodiment of the invention.

FIG. 10 is a flowchart illustrating a method 1000 of providing die-to-die interconnects in a multi-chip package according to an embodiment of the invention. As an example, method 1000 may represent a portion of a manufacturing process that results in the formation of a multi-chip package that is similar to multi-chip package 900 as shown in FIG. 9.

As explained in further detail below, method 1000 generally involves providing a package substrate, machining or otherwise forming a cavity for a silicon or other bridge, dispensing flux onto cavity floor pads, pick and place of the bridge with backside solder bumps, solder reflow with solder self-alignment of the bridge, deflux (unless a no-clean flux or fluxless attachment process is used), encapsulation of bridge, and assembly of active dies. A potential advantage of this process is that it is readily scalable to multiple bridges on a package and many substrates on a panel.

A step 1010 of method 1000 is to provide a substrate having a plurality of embedded pads. As an example, the substrate and the pads can be similar to, respectively, substrate 910 and pads 918 that are shown in FIG. 9.

A step 1020 of method 1000 is to form a cavity in the substrate such that the pads are exposed at a floor of the cavity. As an example, the cavity can be similar to cavity 915 that is shown in FIG. 9. In one embodiment, step 1020 may be accomplished using a laser milling process, a plasma etching/reactive ion etching (RIE) process, or the like. As cavity 915 is formed, electrically non-functional (dummy) or other pads 918 at the cavity floor are exposed. In one embodiment, these were previously fabricated during the conventional substrate buildup process and were buried by one or more dielectric buildup layers. Pads 918 may be made of copper and present a suitable surface finish such as electroless nickel, immersion gold (ENIG), conducive to soldering. A minimum pad thickness of approximately 10 μm may be desirable when laser milling is used for cavity formation, with the laser operation to stop at the pad layer. Mating pads may be provided on the backside of bridge 940 and the bridge may be bumped ahead of time using standard metallization and bumping techniques, perhaps at the wafer level. A solder resist layer may also be added to the backside of bridge 940.

A step 1030 of method 1000 is to provide a bridge having bumps thereon corresponding to the pads. (Such correspondence between bumps and pads may, but does not necessarily, mean the number of bumps and the number of pads are equal to each other; rather, the correspondence is such that the bumps match up with the pads to the degree that a reliable mechanical joining is possible.) As an example, the bridge can be similar to bridge 940, shown in FIG. 9, and can thus in certain embodiments be an active die, and the joints formed can be similar to joints 960, also shown in FIG. 9.

A step 1040 of method 1000 is to place the bridge in the cavity and align the bumps and the pads to each other. Step 1040 attaches the bridge to the substrate. In one embodiment, the alignment of bumps and pads to each other is accomplished using the self-alignment of solder during reflow and joint formation. Solder self-alignment of electronic components where the surface tension of the liquid solder is the driving force is well known in the art. Careful design of a solder joint array can provide self alignment in the x and y dimensions with a positional tolerance in the order of 1 micrometer (hereinafter "micron" or "μm.") Accurate alignment in the z dimension (height) can be achieved by control of the solder volume. The precisely aligned bridge may then be encapsulated, thereby locking the bridge at its precisely defined locations. The resulting hybrid package substrate may then be supplied to a die attach module.

A step 1050 of method 1000 is to provide a first die and a second die. As an example, the first die and the second die can be similar to, respectively, die 920 and die 930, both of which are shown in FIG. 9.

A step 1060 of method 1000 is to attach the first die and the second die to the bridge and the substrate. In one embodiment, step 1060 comprises a flux dispense step, die pick-and-place steps, and a reflow step.

As mentioned elsewhere herein, at very high I/O densities and very fine bridge interconnect pitches, accurate alignment becomes important in order to facilitate a successful assembly of the MCP (die attach). Thus, in certain embodiments, and as shown in FIG. 9, joints 960 located at the backside (i.e., side 942) of bridge 940 are utilized to achieve precise alignment of bridge 940 with respect to other package substrate bumps. It is well known that solder self-alignment can enable ultimate component placement in the x and y dimensions with a positional tolerance on the order of 1 µm. As an alternative to solder, suitable non-conductive materials that are capable of providing self-alignment based on the underlying surface tension principle (minimization of adhesion energy during bonding) could also be used.

A step 1070 of method 1000 is to attach the bridge to the substrate using a wirebond. As an example, the wirebond can be similar to wirebonds 241 that are shown in FIG. 2 or to wirebonds 841 that are shown in FIG. 8. Step 1070 may be performed, for example, in embodiments where the bridge is an active die. It should be understood, however, that step 1070 is not necessarily performed in every embodiment of method 1000.

Figure 11A:
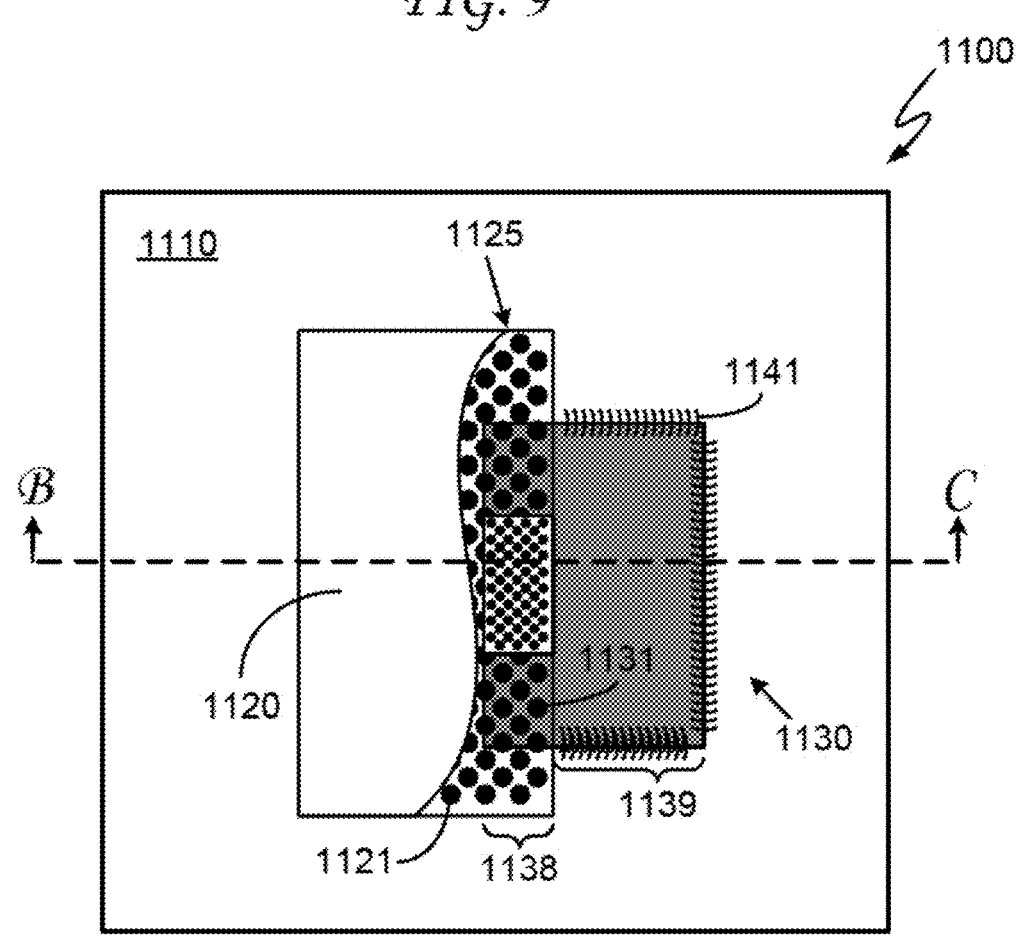
FIG. 11A is a plan view and FIGS. 11B and 11C are cross-sectional views of a multi-chip package according to other embodiments of the invention.
Figure 11B:
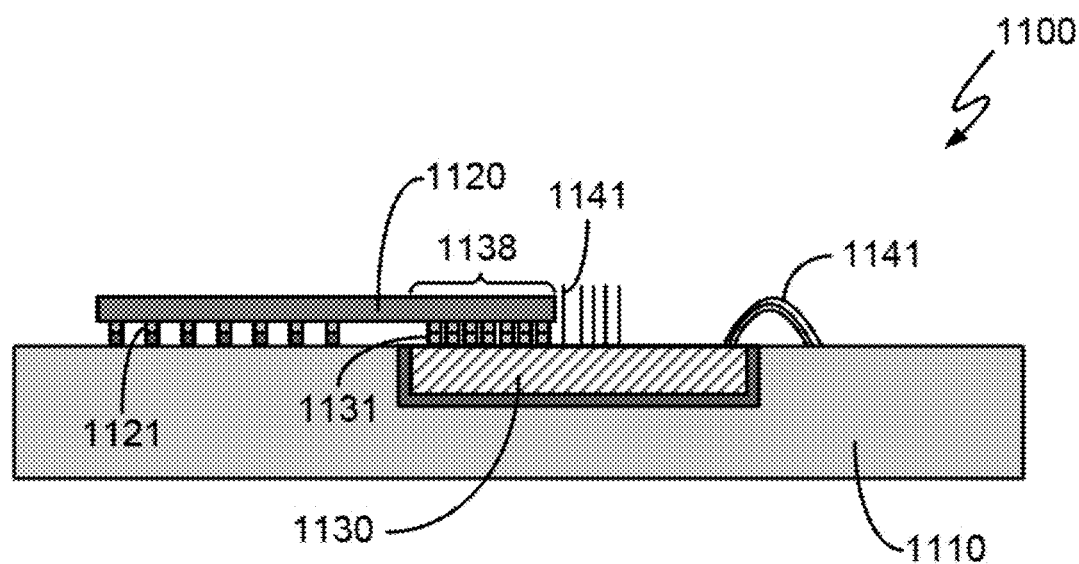
Figure 11C:
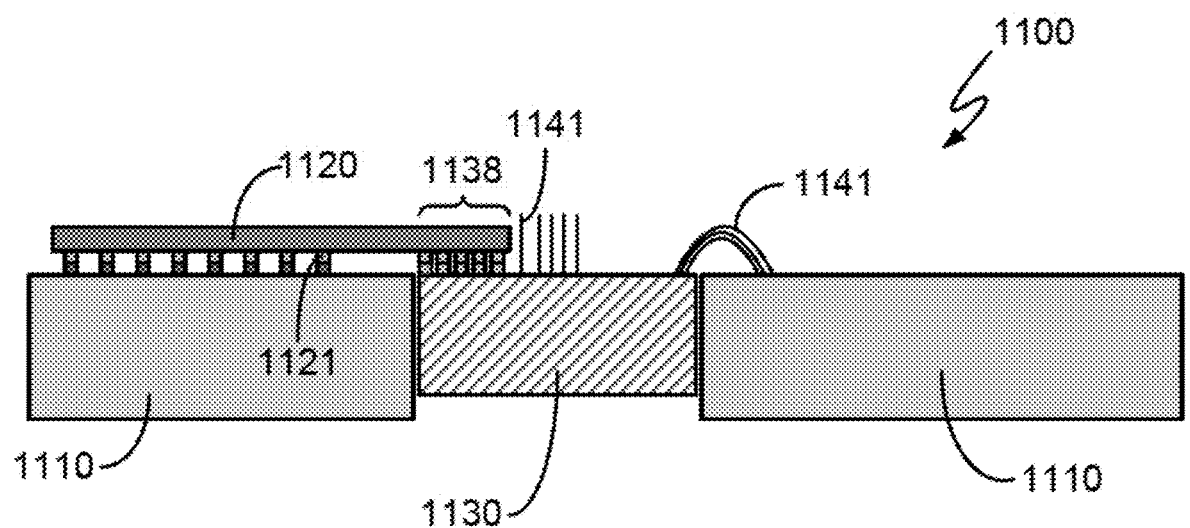

FIG. 11A is a plan view of a multi-chip package 1100 according to an embodiment of the invention. Cross-sectional views for two different embodiments of multi-chip package 1100, each taken at a line B-C in FIG. 11A, are shown in FIGS. 11B and 11C. As illustrated in FIGS. 11A-11C, multi-chip package 1100 comprises a substrate 1110, an active die 1120 attached to substrate 1110 using flip-chip connections 1121 (in FIG. 11A these are visible in a portion 1125 of active die 1120 that is depicted (for illustrative purposes) as being transparent), and an active die 1130, which is attached to active die 1120 using a flip-chip connection 1131 and which is attached to substrate 1110 using wirebonds 1141.

As may be seen in the figure, multi-chip package 1100 is an example of an embodiment where a satellite die assembled in a hybrid manner is attached to a single on-package (processing unit) die. Such an arrangement allows for high-density, high-speed flip-chip connectivity between the processing unit and the satellite die and further allows for the processing unit die to utilize the functionality of the satellite die. In cases where high-density interconnects are not needed (e.g., because of the functionality of the satellite die), the flip-chip interconnects may have a relatively coarse pitch. Additional connections needed by the satellite die such as, but not limited to, power and ground connectivity, may be provided by wirebonds located on sides of the satellite die not obscured by the processing unit die.

In certain embodiments substrate 1110 contains a cavity in which active die 1130 is at least partially located. Such a cavity is visible in FIG. 11B and examples may also be seen in FIGS. 6, 8, and 9. In other embodiments, (see FIG. 11C) substrate 1110 has a first side, an opposing second side, and a third side that extends from the first side to the second side (not identified with reference numerals in FIG. 11C, but such as may form an aperture or slot as discussed above), active die 1120 is attached to the first side of substrate 1110 using flip-chip connections 1121, active die 1130 is attached to substrate 1110 using wirebonds 1141, and no portion of substrate 1110 is underneath active die 1130. These embodiments are similar to those described in connection with FIGS. 1A-1C and FIG. 2. In each of these cases, such cavities, apertures, slots, and the like that house the satellite dies may partially overlap with the bump field of the processing unit dies in order to enable flip-chip, high-speed, high-density connections between satellite die and processing unit die as described herein.

Active die 1130 has a region 1138 and a region 1139, where region 1138 is an overlap region located between active die 1130 (below) and a portion of active die 1120 (above). As shown, the overlap region can be a partial overlap of active dies 1120 and 1130 such that the lower die is not completely underneath the upper die. The overlap region may be the location of one or more face-to-face flip-chip connections that electrically or optically connect the active dies to each other. Referring again to the illustrated embodiment, flip-chip connection 1131 is located in region 1138 while wirebonds 1141 are attached to active die 1130 in region 1139.

In the illustrated embodiment, active die 1130 is attached to substrate 1110 using wirebonds 1141. Note that one edge of active die 1130 is shown as having a double row of wirebonds. In some (non-illustrated) embodiments three or more wirebond rows may be fabricated. Such multiple rows, however, may not achieve the same fine pitches that are achievable with single rows, which may be as small as a pad pitch of 35 µm (corresponding to approximately 29 bonds/mm die edge). For power and ground connections, minimum pitch wirebond capability may not be needed and a thicker bond wire at a lower pitch may be acceptable or even favorable. It should be understood that the illustration, like all of the illustrations referred to herein, is not intended to be limiting, and that non-illustrated embodiments may employ more or fewer double wirebond rows (including embodiments having no such rows), one or more sections having more than two wirebond rows, longer or shorter rows having more or fewer wirebonds, wirebonds along only certain sides but not all sides of the active die, or any other useful wirebond configuration.

In one embodiment, active die 1120 is a processing unit die such as a central processing unit (CPU), a graphics processing unit (GPU), or the like, while active die 1130 is a satellite die with functionality such as memory (including volatile memory such as fast DRAM, external SRAM, eDRAM, and the like and non-volatile memory such as flash memory and the like), graphics processing, voltage regulation for power delivery, radio frequency (RF), or the like, including useful combinations thereof. A satellite die according to various embodiments could even be a microelectromechanical system (MEMS) chip, a sensor chip for use in a system-on-package (SoP), or a photonics die with optoelectronic functionality. Active die 1130 is sometimes referred to herein as a satellite die because it is connected to, and may share active functionality with, active die 1120. In certain embodiments, active die 1130 may also be connected to and share active functionality with one or more other dies (not illustrated in FIGS. 11A-11C) in addition to active die 1120. In cases where the satellite die is connected to more than one active die the satellite die may or may not electrically or optically connect those active dies to each other, or in other words may or may not act as a bridge between those active dies in a manner that is explained elsewhere herein.

Figure 12:
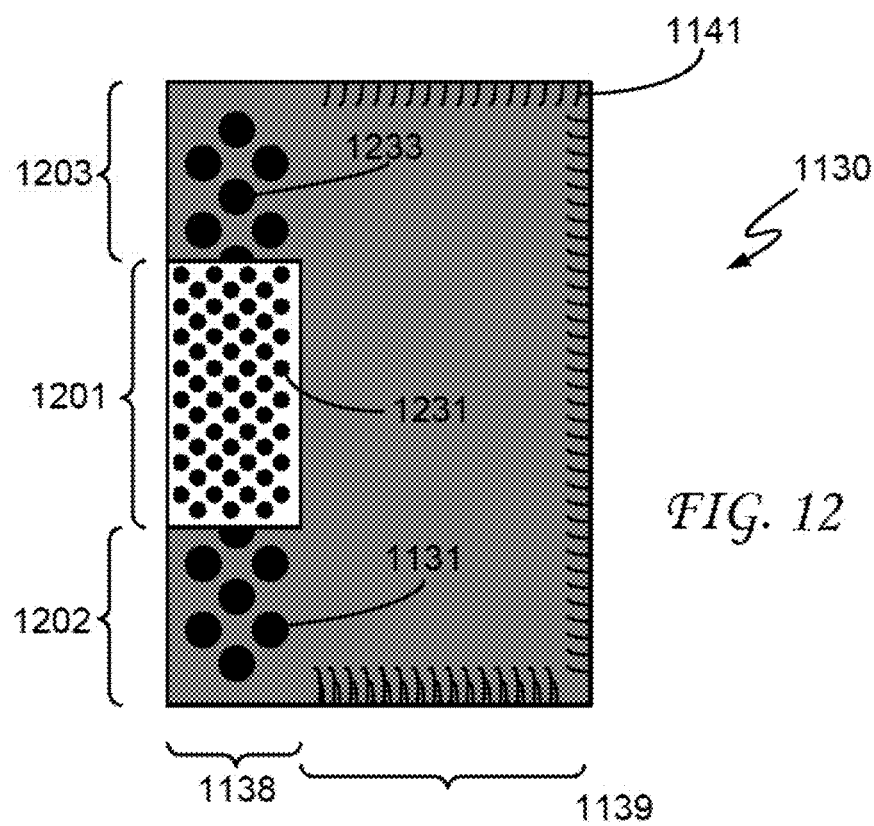
FIG. 12 is a plan view of one of the active dies in the multi-chip package of FIGS. 11A-11C according to an embodiment of the invention.

FIG. 12 is a plan view of active die 1130 according to an embodiment of the invention. The scale of active die 1130 is slightly larger in FIG. 12 than it is in FIGS. 11A-11C. As illustrated in FIG. 12, region 1138 of active die 1130 has a section 1201 and a section 1202. Section 1201 contains a plurality of flip-chip connections 1231 having a first density and section 1202 contains a plurality of flip-chip connections 1131 (first introduced in FIG. 11A) having a second density that is less than the first density. The higher-density and lower-density connections can be used as necessary depending on the functionality of active die 1130.

In the illustrated embodiment, region 1138 further comprises a section 1203 that contains a plurality of flip-chip connections 1233 having a third density that is also less than the first density and can, in one embodiment, be the same as or substantially similar to the second density. The connections in any one or more of sections 1201, 1202, and 1203 can be used to enable active die 1120 access to the functionality of active die 1130, and vice versa. In the embodiment of FIG. 12, section 1201 is located between section 1202 and section 1203, though other configurations are certainly also possible as will be readily apparent to one of ordinary skill in the art. For example, active die 1130 may have flip-chip connections of only a single (high) density, only a single (standard or low) density, one section of high density and another of lower density connections, with these arranged in any suitable configuration, etc. Also, it should be noted here that any one or more of bridges 140, 540, 740, and 940, in embodiments where those bridges are active dies, could have the features, configurations, functionalities, etc. that are described above for active die 1130. Similarly, any one or more of dies 120, 130, 520, 530, 920, and 930 can be similar to active die 1120.

Figure 13:
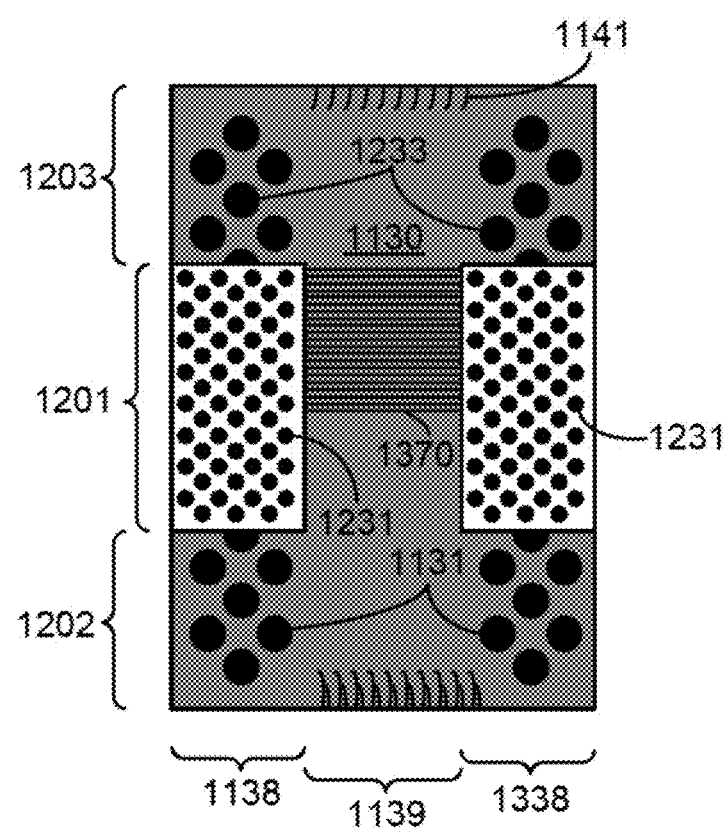
FIG. 13 is a plan view of an active die according to an embodiment of the invention.

It was mentioned above that active die 1130 may be connected to one or more active dies in addition to active die 1120. In some embodiments, as also mentioned, active die 1130 acts as a bridge between active die 1120 and those additional active dies. Examples of this are depicted in FIGS. 1A-1C, FIG. 2, and FIGS. 6-9 if the bridges in those figures are assumed to be active dies. FIG. 13 further illustrates a possible configuration for an active bridge or satellite die 1330 according to an embodiment of the invention.

As illustrated in FIG. 13, active die 1330 comprises a region 1338 that is similar to region 1138. For example, in the illustrated embodiment region 1338, like region 1138, contains sections 1201, 1202, and 1203, each containing the features and components described above. Electrically and/or optically conductive bridge traces 1370, which extend between section 1201 of region 1138 and the corresponding section of region 1338, provide an electrical or optical connection between dies that are bridged by active die 1330. These dies are not shown in FIG. 13, but would, for example, be attached to active die 1330 using flip-chip connections 1131, 1231, and 1233 in a manner similar to that described above for active die 1120.

Figure 14:
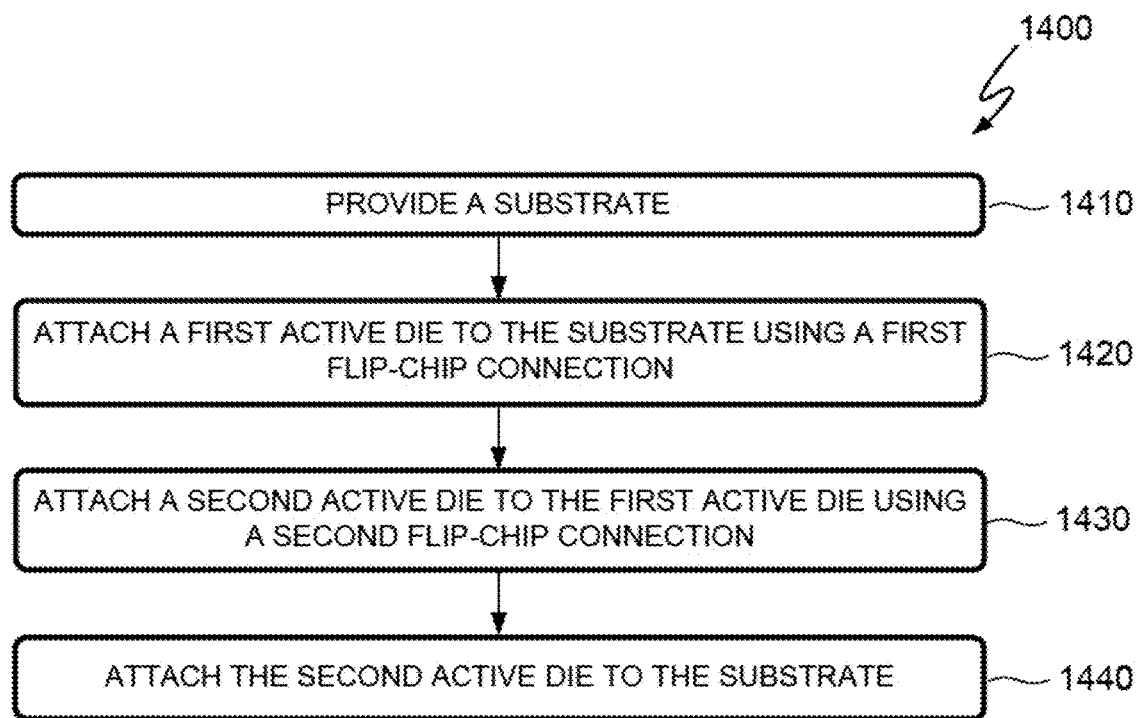
FIG. 14 is a flowchart illustrating a method of providing die-to-die interconnects in a multi-chip package according to another embodiment of the invention.

FIG. 14 is a flowchart illustrating a method 1400 of providing die-to-die interconnects in a multi-chip package according to an embodiment of the invention. As an example, method 1400 may result in an MCP such as that shown in FIG. 11C. (An MCP such as that shown in FIG. 11B may be formed using a method similar to method 400 or method 1000 with the second die being omitted.)

A step 1410 of method 1400 is to provide a substrate. As an example, the substrate can be similar to substrate 1110 as it is shown in FIG. 11C.

A step 1420 of method 1400 is to attach a first active die to the substrate using a first flip-chip connection. As an example, the first active die and the first flip-chip connection can be similar to, respectively, active die 1120 and flip-chip connections 1121, both of which are shown in FIGS. 11A-11C.

A step 1430 of method 1400 is to attach a second active die to the first active die using a second flip-chip connection. As an example, the second active die and the second flip-chip connection can be similar to, respectively, active die 1130 and flip-chip connections 1131, both of which are first shown in FIG. 11A.

A step 1440 of method 1400 is to attach the second active die to the substrate. In one embodiment, the second active die is attached to the substrate using a wirebond such as wirebond 1141 that are first shown in FIG. 11A.

Figure 15:
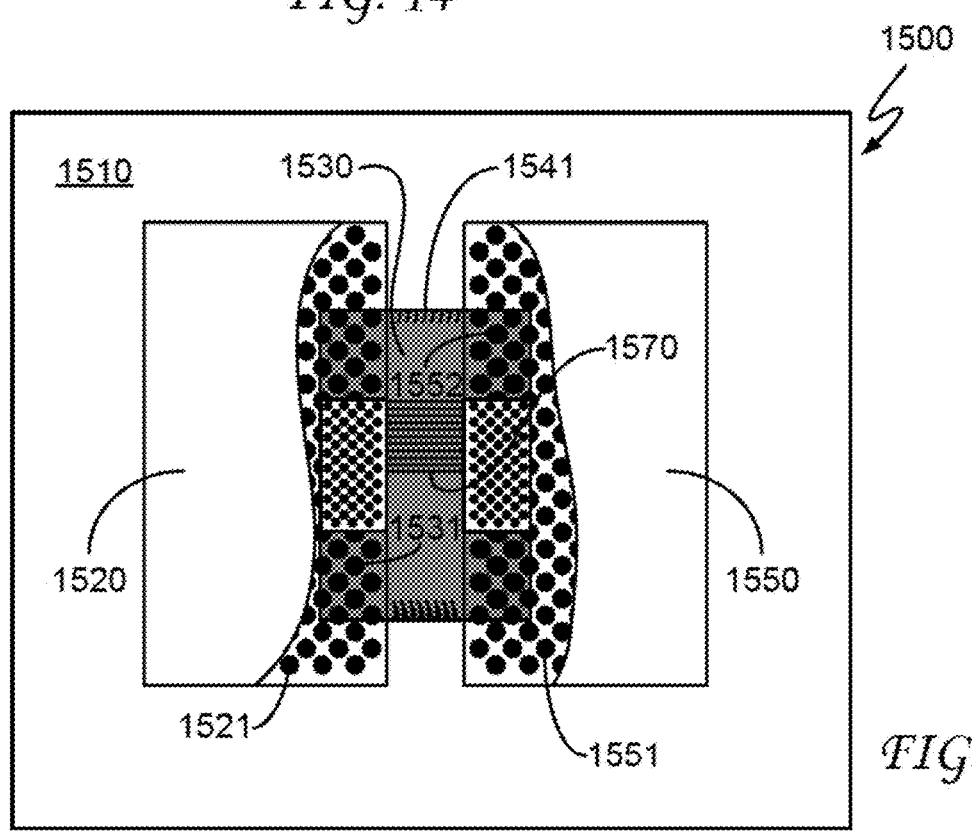
FIG. 15 is a plan view of a multi-chip package according to another embodiment of the invention.

FIG. 15 is a plan view of a multi-chip package 1500 according to an embodiment of the invention. As illustrated in FIG. 15, multi-chip package 1500 comprises a substrate 1510, an active die 1520 attached to substrate 1510 using flip-chip connections 1521, an active die 1530 attached to active die 1520 using flip-chip connections 1531 and to substrate 1510 using wirebonds 1541, and an active die 1550 attached to substrate 1510 using flip-chip connections 1551 and attached to active die 1530 using flip-chip connections 1552. Active die 1520 is electrically and/or optically connected to active die 1550 via electrically and/or optically conductive bridge traces 1570 located in active die 1530. Active die 1530 thus acts as a bridge connecting active dies 1520 and 1550.

In the illustrated embodiment, active dies 1520 and 1550 have regions and sections the same as or similar to those described above in connection with active die 1120 and shown in FIGS. 11A-11C, with the features located in those regions and sections, and the characteristics of those features, being similar as well.

Figure 16:
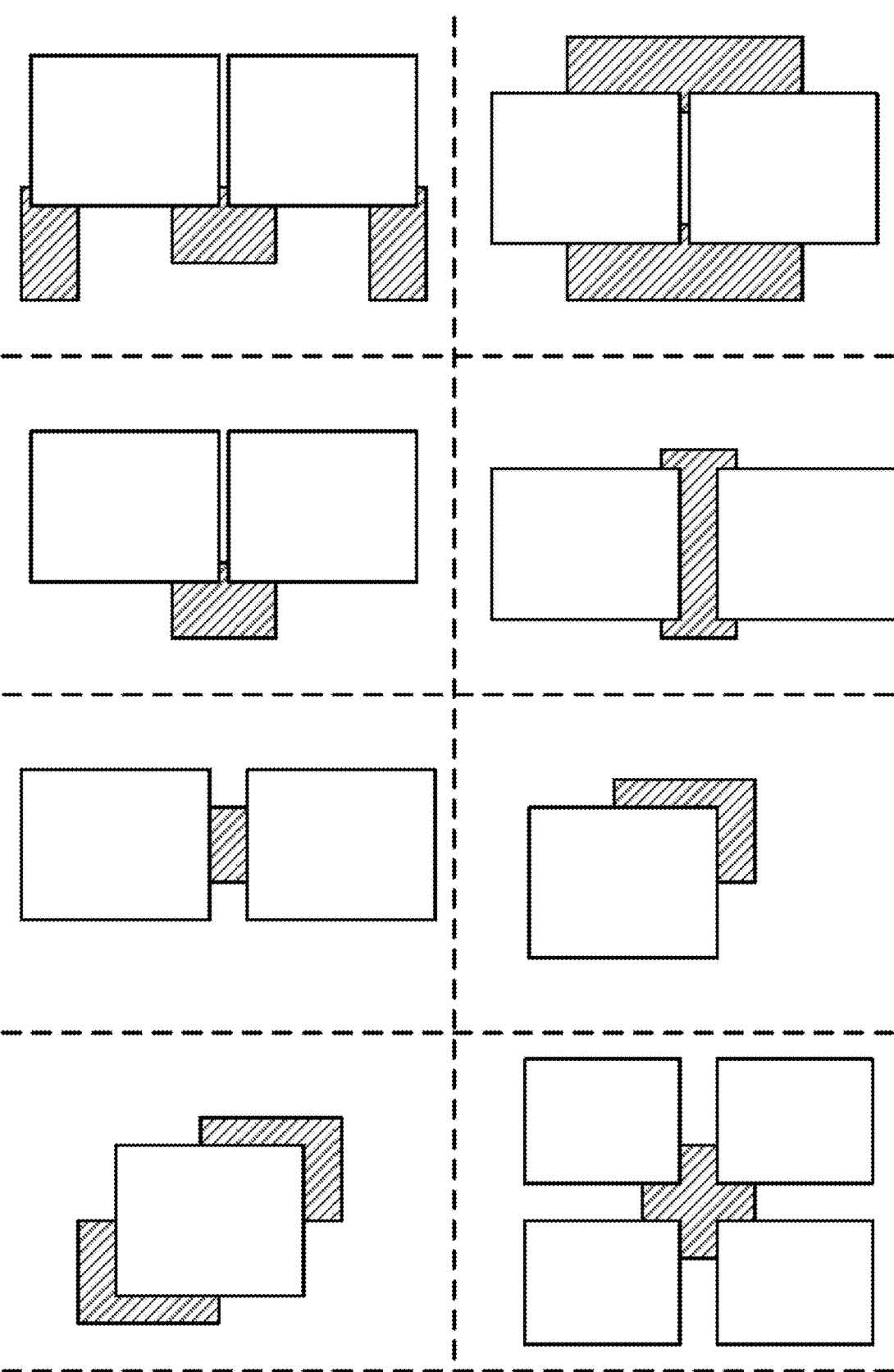
FIG. 16 illustrates some examples of multi-chip package geometries according to various embodiments of the invention.

In certain embodiments substrate 1510 contains a cavity in which active die 1530 is at least partially located. Such a cavity is not visible in FIG. 15 but examples may be seen in FIGS. 6, 8, and 9. In other embodiments, substrate 1510 has a first side, an opposing second side, and a third side that extends from the first side to the second side (such as may form an aperture or slot as discussed above), active dies 1520 and 1550 are attached to the first side of substrate 1510, and no portion of substrate 1510 is underneath active die 1530. These embodiments are not explicitly illustrated in FIG. 15 but are similar to those described in connection with FIGS. 1A-1C and FIG. 2. In each of these cases, such cavities, apertures, slots, and the like that house the satellite dies may partially overlap with the bump field of the processing unit dies in order to enable flip-chip, high-speed, high-density connections between satellite die and processing unit die as described herein. Some examples of MCP package geometries showing such partial overlaps are shown in FIG. 16, where the bridge/satellite die is cross-hatched and the processing unit dies are shown plain. (Package substrates are not shown in FIG. 16.) It will be understood that the illustrated examples represent only a fraction of the large number of possible configurations.

Figure 17:
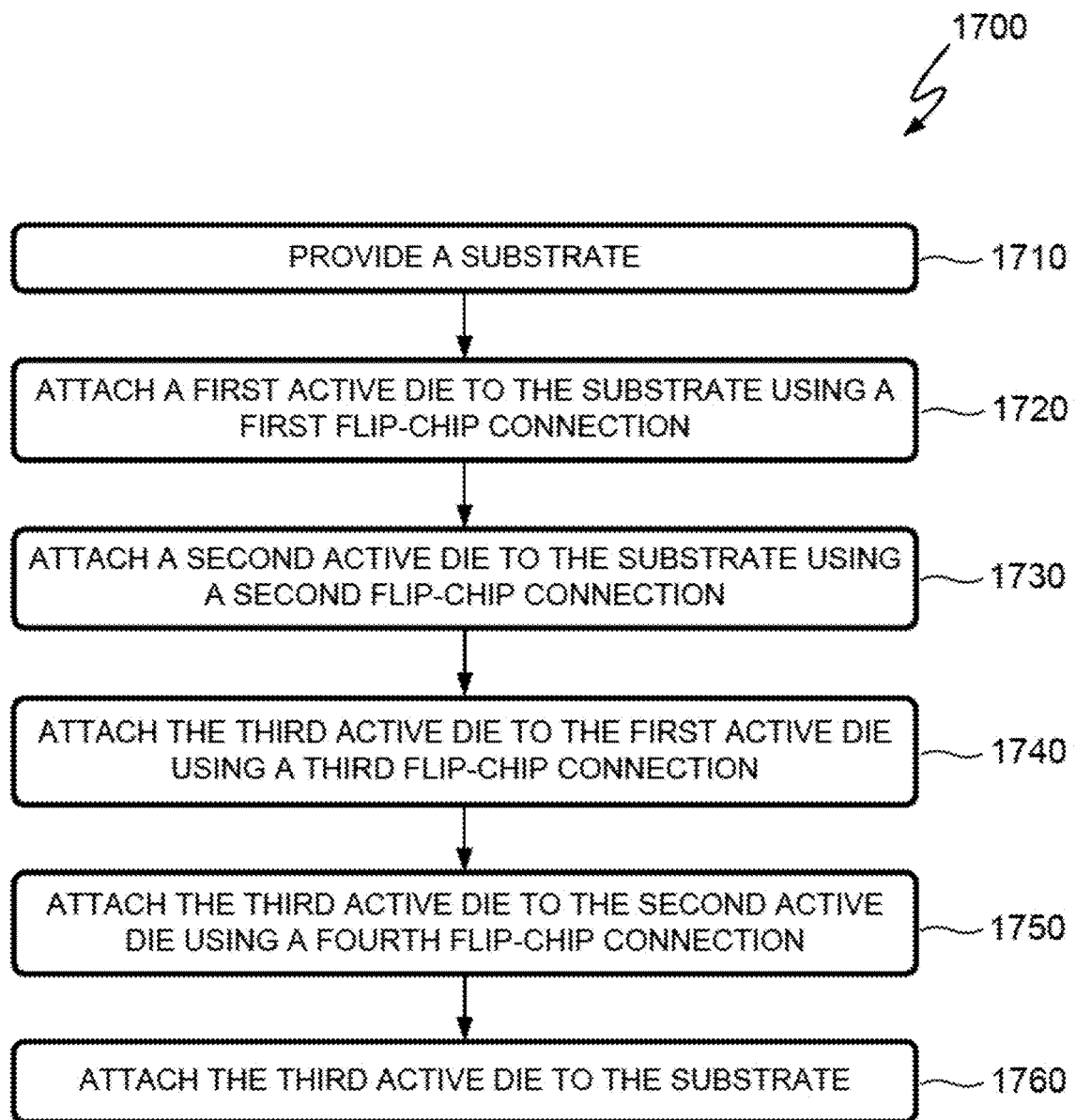
FIG. 17 is a flowchart illustrating a method of providing die-to-die interconnects in a multi-chip package according to another embodiment of the invention.

FIG. 17 is a flowchart illustrating a method 1700 of providing die-to-die interconnects in a multi-chip package according to an embodiment of the invention. As an example, method 1700 may result in an MCP such as that shown in FIG. 15. Described below is a "bridge last" process flow similar to that described by method 300. The FIG. 15 structure may also be manufactured with a substrate having a cavity similar to the substrates shown in FIG. 8 or 9. Process flows suitable to manufacture such structures may proceed along the lines of methods 400 and 1000, with a third active die as discussed below standing in for the bridge of those methods.

A step 1710 of method 1700 is to provide a substrate. As an example, the substrate can be similar to substrate 1510 that is shown in FIG. 15.

A step 1720 of method 1700 is to attach a first active die to the substrate using a first flip-chip connection. As an example, the first active die and the first flip-chip connection can be similar to, respectively, active die 1520 and flip-chip connections 1521, both of which are shown in FIG. 15.

A step 1730 of method 1700 is to attach a second active die to the substrate using a second flip-chip connection. As an example, the second active die can be similar to active die 1550 and the second flip-chip connection can be similar to flip-chip connections 1551, both of which are shown in FIG. 15.

A step 1740 of method 1700 is to attach the third active die to the first active die using a third flip-chip connection.

As an example, the third flip-chip connection can be similar to flip-chip connections 1531 that are shown in FIG. 15.

A step 1750 of method 1700 is to attach the third active die to the second active die using a fourth flip-chip connection. As an example, the fourth flip-chip connection can be similar to flip-chip connections 1552 that are shown in FIG. 15. With the third active die attached to both the first and the second active dies, and because the third active die contains electrically and/or optically conductive bridge traces as described above and shown in FIG. 15, method 1700 inherently results in the first and the second active dies being electrically and/or optically connected to each other. Alternatively, method 1700 could include an additional step that results in such an electrical or optical connection.

A step 1760 of method 1700 is to attach the third active die to the substrate. In one embodiment, step 1760 comprises attaching the third active die to the substrate using wirebonds.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the multi-chip packages and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of providing die-to-die interconnects in a multi-chip package, the method comprising:
    providing a substrate having a first side, an opposing second side, and a third side that extends from the first side to the second side;
    attaching a first die to the first side of the substrate such that a portion of the first die extends beyond an edge of the first side of the substrate; attaching a second die to the first side of the substrate such that a portion of the second die extends beyond the edge of the first side of the substrate;
    providing a bridge containing a plurality of electrically or optically conductive features;
    positioning the bridge adjacent to the third side of the substrate such that no portion of the substrate is underneath the bridge; and
    attaching the bridge to the first die and to the second die, thereby creating a connection between the first die and the second die.

2. The method of claim 1 wherein:
    the bridge comprises silicon.

3. The method of claim 2 wherein:
    the bridge comprises an active die that constitutes a third die of the multi-chip package; and
    the bridge is attached to the first die and to the second die using flip-chip connections.

4. The method of claim 3 further comprising:
    attaching the bridge to the substrate using a wirebond.

5. The method of claim 2 wherein:
    attaching the bridge comprises using a thermocompression bonding process.

6. The method of claim 2 wherein:
    attaching the bridge comprises using a solder reflow process.

7. The method of claim 2 wherein:
    providing the substrate comprises forming an aperture through the substrate such that the third side constitutes a portion of an inside perimeter of the substrate.

8. The method of claim 2 wherein:
    providing the substrate comprises forming a slot in the substrate such that the third side constitutes a portion of an outside perimeter of the substrate.

9. A method of providing die-to-die interconnects in a multi-chip package, the method comprising:
    attaching a first die and a second die to a carrier;
    attaching a bridge to the first die and attaching the bridge to the second die;
    providing a substrate; and
    attaching the first die and the second die to the substrate.

10. The method of claim 9 wherein:
    the substrate has a cavity therein; and
    attaching the first die and the second die to the substrate comprises locating the bridge within the cavity.

11. The method of claim 9 further comprising:
    removing the carrier.

12. The method of claim 9 wherein:
    the carrier comprises a heat spreader.

13. The method of claim 9 wherein:
    attaching the bridge comprises using a thermocompression bonding process.

14. The method of claim 9 wherein:
    the bridge comprises silicon.

15. The method of claim 14 wherein:
    the bridge comprises an active die that constitutes a third die of the multi-chip package;
    the bridge is attached to the first die and to the second die using flip-chip connections; and
    the method further comprises attaching the bridge to the substrate using a wirebond.

16. A method of providing die-to-die interconnects in a multi-chip package, the method comprising:
    providing a substrate having a plurality of embedded pads;
    forming a cavity in the substrate such that the pads are exposed at a floor of the cavity;
    providing a bridge having bumps thereon corresponding to the pads;
    placing the bridge in the cavity and aligning the bumps and the pads to each other;
    providing a first die and a second die; and
    attaching the first die and the second die to the bridge and the substrate.

17. The method of claim 16 wherein:
    the bridge comprises silicon.

18. The method of claim 17 wherein:

the bridge comprises an active die that constitutes a third die of the multi-chip package;

the bridge is attached to the first die and to the second die using flip-chip connections; and the method further comprises attaching the bridge to the substrate using a wirebond.

19. The method of claim 16 wherein:

forming the cavity comprises using one of a laser milling and a plasma etching process.

\* \* \* \* \*